United States Patent
Yonekawa et al.

(10) Patent No.: US 6,330,052 B1
(45) Date of Patent: *Dec. 11, 2001

(54) EXPOSURE APPARATUS AND ITS CONTROL METHOD, STAGE APPARATUS, AND DEVICE MANUFACTURING METHOD

(75) Inventors: Masami Yonekawa, Utsunomiya; Yozo Fukagawa, Kawachi-machi, both of (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/289,721

(22) Filed: Apr. 12, 1999

Related U.S. Application Data

(63) Continuation-in-part of application No. 09/094,503, filed on Jun. 10, 1998, now abandoned.

(30) Foreign Application Priority Data

| Jun. 13, 1997 | (JP) | 9-171259 |
| Jul. 25, 1997 | (JP) | 9-213876 |
| Apr. 16, 1998 | (JP) | 10-121665 |
| May 11, 1998 | (JP) | 10-142090 |

(51) Int. Cl.[7] .......................... G03B 27/42; G03B 27/54; G03B 27/58
(52) U.S. Cl. ................... 355/53; 355/67; 355/72
(58) Field of Search .................. 355/30, 53, 55, 355/67, 77, 72; 356/399, 400, 358

(56) References Cited

U.S. PATENT DOCUMENTS

| 5,090,131 | * | 2/1992 | Deer | 33/556 |
| 5,114,234 | * | 5/1992 | Otsuka et al. | 356/358 |
| 5,446,519 | * | 8/1995 | Makinouchi | 355/53 |
| 5,467,720 | * | 11/1995 | Korenage et al. | 108/20 |
| 5,528,118 | * | 6/1996 | Lee | 318/568.17 |
| 5,658,700 | * | 8/1997 | Sakai | 430/30 |
| 5,781,277 | * | 7/1998 | Iwamoto | 355/53 |
| 5,812,420 | * | 9/1998 | Takahashi | 364/508 |
| 5,854,819 | * | 12/1998 | Hara et al. | 378/34 |
| 5,933,215 | * | 8/1999 | Inoue et al. | 355/53 |

FOREIGN PATENT DOCUMENTS 4-291910  10/1992 (JP).

* cited by examiner

*Primary Examiner*—Russell Adams
*Assistant Examiner*—Hung Henry Nguyen
(74) *Attorney, Agent, or Firm*—Fitzpatrick, Cella, Harper & Scinto

(57) ABSTRACT

An exposure apparatus, which includes a projection optical system for forming an image of a pattern formed on a master plate, a substrate stage for holding and moving a substrate to be exposed to an imaging position, a position measurement device for measuring a position of the master plate or substrate or relative positions of the master plate and substrate, an alignment device for moving the master plate or substrate on the basis of a measurement value of the position measurement device to adjust the position or relative positions, a main body structure for holding the projection optical system, the substrate stage, and the position measurement device, and a support base for supporting the main body structure. The apparatus includes a measurement device for measuring a variation amount of a principal force acting between the main body structure and the support base or a physical quantity acting on the main body structure, and a correction device for correcting a measurement value of the measurement device using a correction vector obtained by multiplying the measurement result of the measurement device by a predetermined coefficient matrix.

12 Claims, 24 Drawing Sheets

EXPOSURE APPARATUS AND ITS CONTROL METHOD, STAGE APPARATUS, AND DEVICE MANUFACTURING METHOD

This is a continuation-in-part application of U.S. patent application Ser. No. 09/094,503 filed on Jun. 10, 1998 abandoned entitled "EXPOSURE APPARATUS AND ITS CONTROL METHOD, AND DEVICE MANUFACTURING METHOD".

BACKGROUND OF THE INVENTION

The present invention relates to an exposure apparatus such as an exposure apparatus (so-called a stepper) for sequentially projecting and forming an electronic circuit pattern on a reticle surface onto a wafer surface by step & repeat exposure via a projection optical system in the manufacture of semiconductor elements such as ICs, LSIs, and the like, an exposure apparatus (so-called a scanner) for similarly sequentially projecting and forming an electronic circuit pattern on a reticle surface onto a wafer surface by step & scan exposure via a projection optical system, and the like, and so on, and a device manufacturing method that uses the exposure apparatus and, more particularly, to an exposure apparatus used in the manufacture of semiconductor elements, which is hardly influenced by deformation of the main body structure by detecting in advance the relationship between the deformation state of the main body structure and stage precision, and in actual exposure adequately measuring the deformation state and correcting the alignment measurement value and alignment position of a shot in real time, and a device manufacturing method using the apparatus.

The present invention further relates to a high-speed, high-precision alignment stage apparatus which can be suitably applied to, e.g., reticle and wafer moving stages of semiconductor exposure apparatuses, an exposure apparatus having the alignment stage apparatus, and a device manufacturing method of manufacturing a device using this exposure apparatus.

In recent years, as semiconductor integrated circuits such as ICs, LSIs, and the like continue to shrink in feature size, a projection exposure apparatus is required to have further improved image performance, superposing precision, throughput, and the like. The superposing precision can be roughly classified into global components of the shot matrix within a wafer and components within each shot. The former components can be generally subdivided into a wafer shift component, wafer magnification component, wafer rotation component, orthogonality component, and the like. The latter components can be generally accounted for by a shot (chip) magnification component, shot (chip) distortion component, shot (chip) rotation component, and the like. Among these errors, error components produced by deformation of the main body structure have gradually surfaced due to improvements of the apparatus performance.

The error components produced by deformation of the structure are classified into static components reproduced every time wafer and reticle stages move, and dynamic components such as heat, repulsive force due to step & scan exposure, and the like, which are hard to reproduce.

In order to remove these error components, conventionally, the rigidity of the main body structure is increased; a structure which does not deform even when an external force is slightly applied to the structure, or a structure which does not follow disturbance vibrations due to raised natural frequency is exploited. However, as the rigidity of the main body increases, the weight increases accordingly, and a design that can attain both a weight reduction and high rigidity becomes hard to achieve. When a product is designed in consideration of only high rigidity of the main body, evidently the weight of the main body becomes large, and the obtained product is hard to handle in terms of carrying out/in, installation, and the like of the apparatus.

As measures against heat that have been conventionally taken, the heat source of the apparatus is cooled, its heat generation amount is reduced, a low thermal expansion material is used in a structure, and so on. However, there are more than one heat source in the apparatus, and it is impossible to cool all these sources. Furthermore, even when measures against heat conduction or transfer from the heat sources are taken, an effective measure cannot often be taken for radiation, and thermal influences remain unsolved. Also, the use of a low thermal expansion material in the structure results in higher cost than a normal material, and yet the thermal influences of the heat sources cannot be perfectly removed.

As described above, deformation factors of the main body include dynamic factors such as vibrations, forces, and the like, and thermal factors.

In the former factors, dynamic and static deformations attributed to the repulsion forces of the stages that support the main body structure, and dynamic and static deformations caused by a vibration control/vibration reduction device used for the purpose of controlling vibrations of the main body upon driving of the stages have large components. Of these components, alignment measurement data, print data, and the like indicate that the deformation component due to the force applied to the main body by the vibration control/vibration reduction device to control vibrations of the main body is by no means negligible. Since this deformation component is inevitable in terms of the function of the vibration control/vibration reduction device as long as the stages are driven, it is impossible to set the deformations of the main body structure to zero.

The latter factors include changes in ambient temperature, changes in temperature of various heat sources, and the like. Especially, a non-steady process from when the thermal equilibrium state is broken until the thermal equilibrium state is reached again is important for the thermal factors. Since it is impossible to perfectly recognize the thermal behaviors of the individual heat sources and a cooling source such as air in the apparatus, such a non-steady process is produced more or less as long as the apparatus is in operation and processing wafers. Hence, it is impossible to set deformations of the main body structure arising from thermal expansion or shrinkage to zero.

On the other hand, alignment stage apparatuses used in semiconductor exposure apparatuses are required to have high alignment precision in order to mount position control targets such as wafers and reticles, and thus widely adopt a stage position measurement means using a combination of a high-resolution laser interferometer and laser mirror.

However, since the position control point and position measurement point do not coincide with each other, deformations arising from changes in temperature and changes in stress cause position measurement errors.

To solve this problem, Japanese Patent Laid-Open No. 4-291910 discloses a method of correcting variations in distance between the position control point and position measurement point. More specifically, as shown in FIG. 26, variations in distance between a laser mirror 2101 as a position measurement target and a wafer 2102 as a position control target are measured by an electric micrometer 2106, and the measurement values are added to an alignment laser target value.

Even this method cannot correct measurement errors produced by deformation and inclination of a fixing jig 2105 for fixing the electric micrometer 2106 to a top table 2104. That is, since measurement errors cannot be completely corrected as far as an additional critical dimension measurement sensor is used, variations in distance between the position control point and position measurement point must be accurately corrected without using any additional critical dimension measurement sensor.

Of these errors, measurement errors due to changes in temperature can be prevented by using a low thermal expansion material, a temperature adjustment device, and the like. However, high stage speeds for a short moving time increase measurement errors due to elastic deformation, so that demands have arisen for correction of variations in distance due to elastic deformation of the stage.

It is still another object of the present invention to correct alignment measurement errors, focus measurement errors, stage position measurement errors, and the like arising from elastic deformation of a projection main body structure in real time in consideration of the fact that the elastic deformation and measurement errors due to the elastic deformation represent the linear sum of operating forces which cause the elastic deformation.

It is still another object of the present invention to accurately correct variations in distance between the position control point and position measurement point due to elastic deformation of the stage.

SUMMARY OF THE INVENTION

It is an object of the present invention to attain accurate alignment irrespective of deformations of the main body structure in consideration of the conventional problems. It is another object of the present invention to improve exposure precision of an exposure apparatus without impairing the function of the vibration control/vibration reduction device.

In order to achieve the above object, according to the present invention, even when the structure has deformed, the deformation is measured, and alignment data is adequately corrected based on the measurement result, in place of the effort of making strains or distortions (deformations) of the main body structure due to dynamic factors such as vibrations, forces, and the like, and thermal factors close to zero.

More specifically, according to the present invention, an exposure apparatus, which comprises a substrate stage for holding and moving a substrate, position measurement means for measuring a position of the substrate stage, and control means for performing drive control of the substrate stage to align the substrate on the basis of the measured position, aligns the substrate and a master plate, and forms a pattern on the master plate on the substrate by exposure, comprises strain measurement means for measuring strain of a structure to which the position measurement means is fixed, and the control means aligns the substrate by the drive control of the substrate stage in consideration of the measured strain.

Also, according to the present invention, a control method for an exposure apparatus, which comprises a substrate stage for holding and moving a substrate, position measurement means for measuring a position of the substrate stage, and control means for performing drive control of the substrate stage to align the substrate on the basis of the measured position, aligns the substrate and a master plate, and forms a pattern on the master plate on the substrate by exposure, comprises the strain measurement step of measuring strain of a structure to which the position measurement means is fixed, and the control means aligns the substrate by the drive control of the substrate stage in consideration of the measured strain.

Furthermore, according to the present invention, a device manufacturing method for aligning a substrate held on a substrate stage by measuring a position of the substrate stage using position measurement means and controlling the position of the substrate stage based on the measured position, and for forming a pattern on a master disk onto the substrate by exposure, comprises the steps of: measuring strain of a structure to which the position measurement means is fixed; and aligning the substrate by the position control of the substrate stage in consideration of the measured strain.

In order to achieve the other object, according to the present invention, in an exposure apparatus which comprises a projection optical system, a substrate stage which is movable in a direction perpendicular to the optical axis of the projection optical system while carrying a substrate, a main body structure for supporting the projection optical system and substrate stage, and a vibration reduction device for supporting the main body structure and reducing vibration from a floor, when the substrate stage is aligned to sequentially move the substrate set on the substrate stage in turn to a plurality of predetermined shot positions, a force that the vibration reduction device imposes on the main body structure is measured, and an alignment error and/or stage alignment data are/is corrected on the basis of the measurement result. After the substrate stage is aligned to each shot position of the substrate, the circuit pattern on a master plate is illuminated with illumination light of a predetermined wavelength, thereby projecting and forming by exposure the circuit pattern on the substrate on the substrate stage via the projection optical system.

According to the present invention, a control method for an exposure apparatus, which comprises a projection optical system, a substrate stage which is movable in a direction perpendicular to an optical axis of the projection optical system while carrying a substrate, a main body structure for supporting the projection optical system and the substrate stage, a vibration reduction device for supporting the main body structure and reducing vibration from a floor, and control means for aligning the substrate stage to move the substrate mounted on the substrate stage in turn to a plurality of predetermined shot positions, illuminating a circuit pattern on a master plate with illumination light of a predetermined wavelength after the substrate is aligned to each shot position, and projecting and forming the pattern by exposure onto the substrate on the substrate stage via the projection optical system, comprises the measurement step of measuring a force that the vibration reduction device exerts on the main body structure, and the correction step of correcting the aligned position of the substrate stage on the basis of a measurement result at the measurement step.

Also, according to the present invention, a device manufacturing method which uses a projection optical system, a substrate stage which is movable in a direction perpendicular to an optical axis of the projection optical system while carrying a substrate, a main body structure for supporting the projection optical system and the substrate stage, and a vibration reduction device for supporting the main body structure and reducing vibration from a floor, and which aligns the substrate stage to move the substrate mounted on the substrate stage in turn to a plurality of predetermined shot positions, illuminates a circuit pattern on a master plate with illumination light of a predetermined wavelength after the substrate is aligned to each shot position, and projects and forms the pattern by exposure onto the substrate on the substrate stage via the projection optical system, comprises the measurement step of measuring a force that the vibration reduction device exerts on the main body structure, and the correction step of correcting the aligned position of the substrate stage on the basis of a measurement result at the measurement step.

Other features and advantages of the present invention will be apparent from the following description taken in conjunction with the accompanying drawings, in which like reference characters designate the same or similar parts throughout the figures thereof.

According to the present invention, an exposure apparatus, which comprises a projection optical system such as a projection lens for forming an image of a pattern formed on a master plate such as a reticle, a substrate stage for holding and moving a substrate to be exposed such as a semiconductor wafer to an imaging position, position measurement means for measuring a position of the master plate or substrate or relative positions of the master plate and substrate, alignment means for moving the master plate or substrate on the basis of a measurement value of the position measurement means to adjust the position or relative positions, a main body structure for holding the projection optical system, the substrate stage, and the position measurement means, and a support base for supporting the main body structure, comprises means for measuring a variation amount of a principal force acting between the main body structure and the support base or a physical quantity proportional to the variation amount, and correction means for correcting a measurement value of the measurement means using a correction vector obtained by multiplying the measurement result of the measurement means by a predetermined coefficient matrix.

In preferred embodiments of the present invention, the measurement means is a stage position measurement device for measuring a position of the substrate stage, a focus measurement device for measuring a shift in position or posture of a substrate surface with reference to the imaging position, an alignment scope for measuring an alignment mark on the substrate so as to superpose a new pattern on a pattern which has been printed on the substrate surface, or the like. The alignment scope is a TTL on-axis alignment scope for measuring relative positions of alignment marks on the master plate and substrate using light passing on an optical axis of the projection optical system, a TTL off-axis alignment scope for measuring the relative positions of the alignment marks on the master plate and substrate using light passing off the optical axis of the projection optical system, an off-axis alignment scope for measuring the position of the alignment mark on the substrate outside the projection optical system, a reticle alignment scope for measuring a position of a reticle using a mark on a reticle as a master plate, or the like. To align the reticle, the alignment scope further comprises a reticle stage for holding and moving the reticle.

The predetermined coefficient matrix is estimated by measuring by the measurement means the position of the substrate on the substrate stage aligned and controlled to keep a position and posture constant, at the same time applying a forced operating force to respective portions for supporting the main body structure, and regressively analyzing a variation amount of a measurement value of the measurement means with respect to variations in the forced operating force.

Also, according to the present invention, a stage apparatus comprises a stage for holding and moving an object, stage position measurement means for measuring a position of the stage, a sensor for measuring a variation amount of a principal force acting on the stage or a physical quantity proportional to the variation amount, and means for correcting a measurement value of the stage position using a correction vector obtained by multiplying a measurement result of the sensor by a predetermined coefficient matrix.

The stage position measurement means may comprise a laser interferometer and a reflecting mirror.

In general, the apparatus further comprises position measurement means arranged in addition to the stage position measurement means, and the predetermined coefficient matrix is obtained by regressively analyzing a variation amount of a stage drive force of each axis when the stage is moved or a physical quantity proportional to the variation amount, and a difference between measurement values of the position measurement means and the stage position measurement means.

The sensor can be either one of means for monitoring a current value of a motor for driving the stage and a load cell or strain gauge arranged at a portion where a drive repulsion force of the motor acts.

Further, according to the present invention, there are provided an exposure apparatus comprising the stage apparatus and means for exposing a wafer or reticle mounted on the stage apparatus, and a device manufacturing method comprising the step of manufacturing a device using this exposure apparatus.

DETAILED DESCRIPTION OF THE PREFERRED EMBODIMENT

<First Embodiment>

Figure 1:
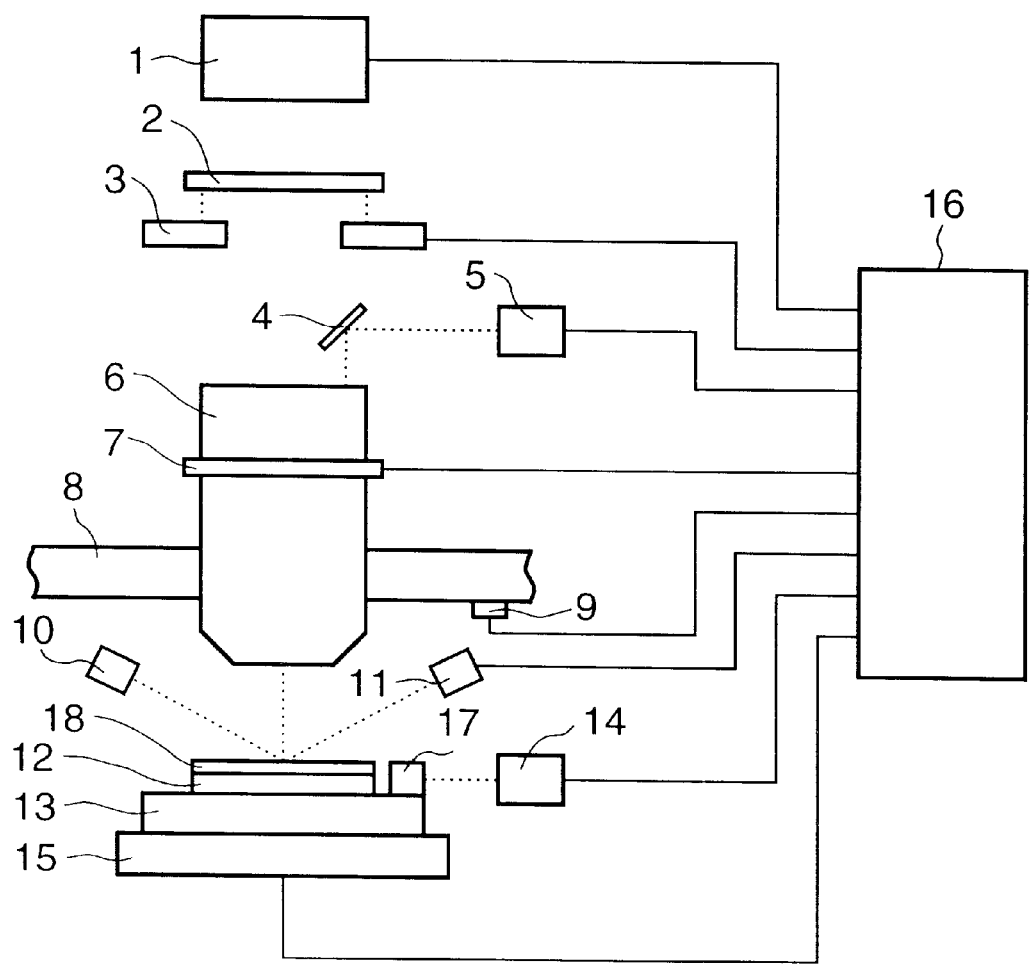
FIG. 1 is a schematic diagram showing principal units of a semiconductor exposure apparatus to which the present invention is applied.

In the first embodiment of the present invention, a substrate is aligned on the basis of the position detected by an alignment measurement means provided to a main body structure to detect the position of a predetermined mark on the substrate.

A master plate stage for aligning a master plate, and a projection optical system for projecting a pattern on the master plate onto a substrate for exposure are placed above the main body structure, and strain is measured at more than one position of the main body structure.

Alignment considering strain can be made in consideration of, e.g., the relationship between strain obtained in advance, and alignment errors produced as a result of substrate alignment regardless of the strain, and strain measured in actual exposure.

Exposure is done by aligning the substrate for a plurality of exposure positions on the substrate. In this case, the substrate stage is stepped upon aligning to each exposure position. Alignment to each exposure position may be attained by global alignment on the basis of the position detected by the alignment measurement means disposed on the structure to detect the position of a predetermined mark on the substrate. In such a case, upon position detection for global alignment, the strain is measured, and the position detection result is corrected on the basis of the measured value. Based on the corrected position detection result, the coordinate data of each exposure position is obtained. When the stage is moved to each exposure position based on the obtained coordinate data, the strain may be measured, and the coordinate data of each exposure position may be corrected based on the measured value to attain alignment to that exposure position. Furthermore, in such a case, to improve the throughput correction for the position detection result, the coordinate data of each exposure position may be made only when the measured value of strain is equal to or larger than a predetermined value.

Strain measurement is done for strain of the structure between a position measurement means for the substrate stage, and the projection optical system.

According to the first embodiment of the present invention, a plurality of strain gauges are adhered to the main body structure while focusing on strains (deformations) of the main body structure, and the deformation state of the structure is measured. The deformation state is always monitored to obtain in advance the relationship between the deformation state and alignment errors or stage lattice errors by experiments or numerical simulations, and correction can be made based on that relationship in actual processes. The actual processes include the measurement for global alignment, and stage alignment upon step & repeat exposure. Each strain gauge is adhered to the main body structure at locations important for the measurement system, i.e., between a projection lens and a laser interferometer (a position measurement means for the substrate stage), the position of the projection lens, or a base portion of the laser interferometer. Alternatively, when the relationship between the strain state and alignment or print errors is obtained in advance, the gauge may be attached to an alignment scope attachment position, reticle stage attachment position, or the like.

With this arrangement, total deformations of the structure produced not only by dynamic factors such as vibrations, forces, and the like, but also by thermal factors are measured, and alignment errors and stage lattice errors arising therefrom can be predicted and corrected. Hence, high superposing (alignment) precision can be maintained independently of deformations of the structure. Furthermore, since performance required for the structure places an importance not on high rigidity but on high reproducibility, the weight can be prevented from being unnecessarily increased. Also, since no expensive low thermal expansion material need be used, an increase in cost can also be prevented.

FIG. 1 shows a principal part of a projection exposure apparatus (stepper) according to the first embodiment of the present invention.

In FIG. 1, reference numeral 1 denotes an illumination system, which illuminates a reticle 2 formed with a Cr-deposited circuit pattern. The illumination system 1 comprises an ultra high-pressure mercury lamp or excimer laser, shutter, illumination optical system, and the like (none of them are shown). Reference numeral 3 denotes a substrate that carries a reticle stage (not shown). The reticle 2 is aligned by a reticle stage drive mechanism with reference to a mark formed on the reticle stage substrate 3. The alignment measurement value is stored in a control unit 16 that controls the overall apparatus.

Reference numeral 6 denotes a projection lens for projecting a circuit pattern image on the reticle 2 formed by the illumination system 1 onto a wafer 18; and 7, a lens drive unit for correcting known changes in imaging performance of the projection lens due to air pressure or exposure.

Reference numeral 8 denotes that portion of a main body structure which mounts principal units such as the projection lens 6, an alignment measurement system, the reticle stage, a wafer stage, and the like. Note that the main body structure 8 is supported by a vibration reduction device (not shown). Reference numeral 9 denotes a strain gauge sensor attached to the main body structure 8. The sensor 9 can measure the deformation state of the main body in real time. Reference numeral 4 denotes a mirror for bending the optical path of probe light used in wafer alignment measurement by an off-axis TTL (Through The Lens) system; and 5, a measurement system therefor. The optical path of alignment light coming from the measurement system 5 is bent through 90° by the mirror 4, and the alignment light enters the projection lens 6 to illuminate an alignment mark formed on the wafer 18. The light reflected by the alignment mark re-enters the alignment measurement system 5 along the same optical path in the reverse direction. In this way, by measuring the relative displacement between the alignment mark and a reference mark (not shown), alignment measurement is done.

A projector 10 and receiver 11 are elements that constitute a known focus wafer tilt detector. The projector 10 irradiates a light beam to make a small angle with the surface of the wafer 18, and light reflected by the surface is photoelectrically detected by the receiver 11, thereby detecting the focus position of the projection lens 6 and any tilt of the wafer 18. Using this detector, the wafer is aligned in the z-direction using a focus tilt drive function of the wafer stage (to be described later) in units of shots or wafers.

Reference numeral 12 denotes a wafer chuck that vacuum-chucks the wafer 18; 13, a θ-z-tilt stage that is coarsely or finely movable in the tilt, θ-, and z-directions; and 15, an x-y stage that is coarsely or finely movable in the x- and y-directions. The wafer stage is made up of the tilt stage 13 and x-y stage 15. The position of the wafer stage is always monitored by a laser interferometer bar mirror 17 attached to the tilt stage 13 and a laser interferometer 14.

The entire exposure apparatus is controlled by a control unit 16 as well as these principal units.

Figure 4:
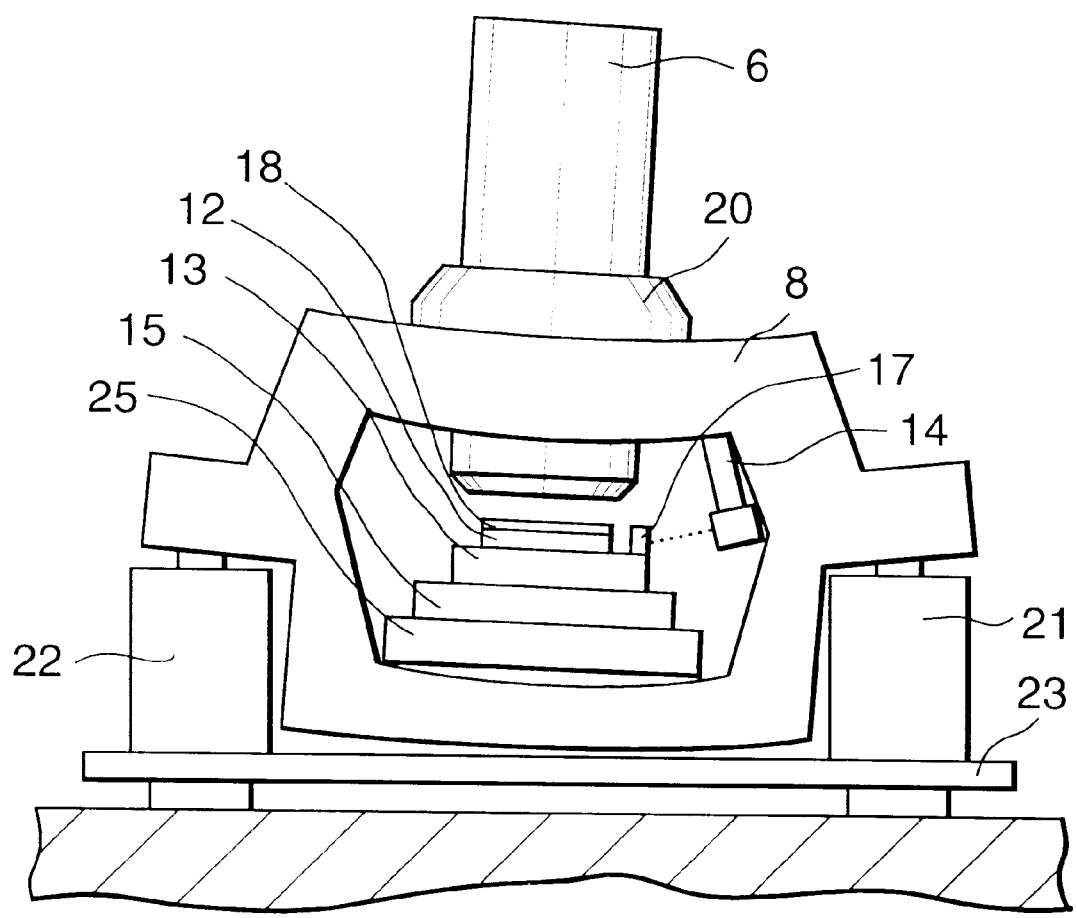
FIG. 4 is a front view showing deformation of the main body structure due to stage stepping.
Figure 5:
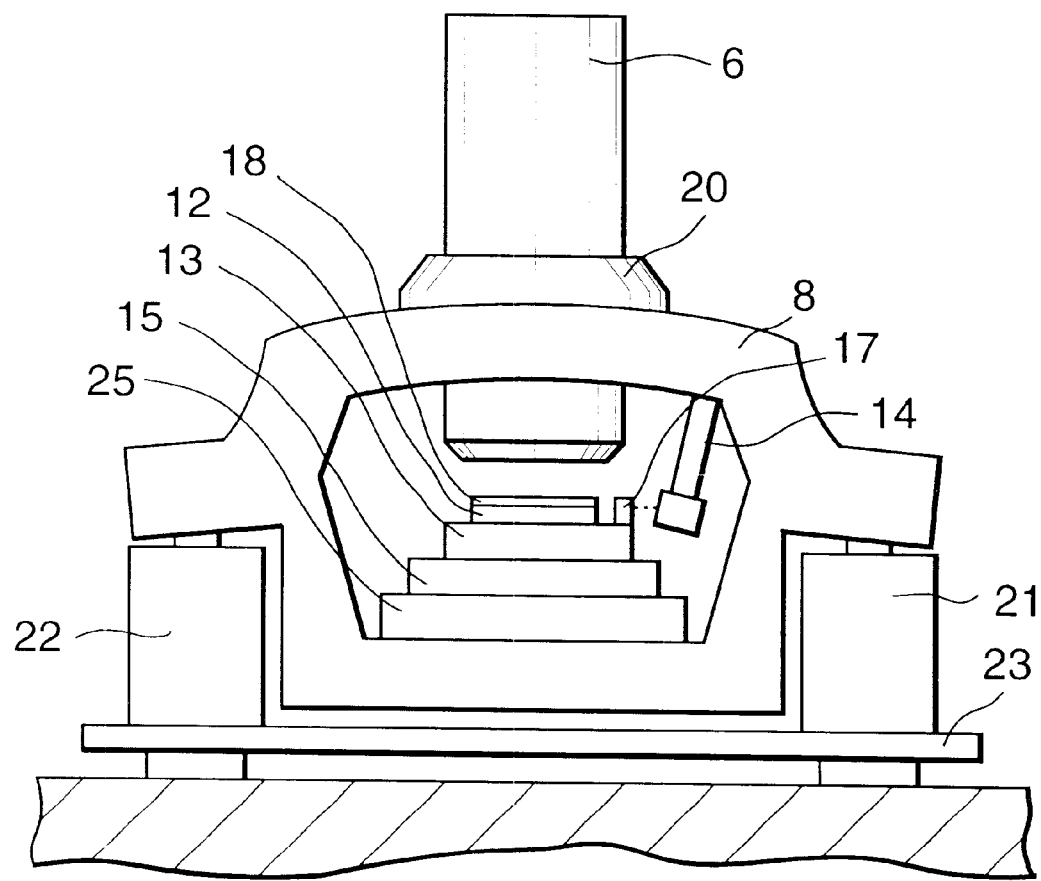
FIG. 5 is a front view showing thermal deformation of the main body structure.

FIG. 4 shows deformation of the main body structure due to mechanical factors such as vibrations, forces, and the like, and FIG. 5 shows deformation due to thermal factors. Since these figures show only main units and members associated with the structure deformations of the stepper, the illumination system, reticle stage, alignment measurement system, and the like are not shown.

FIG. 4 especially shows deformation of the main body structure due to stepping of the wafer stage. In FIG. 4, reference numeral 6 denotes a projection lens; 20, a member that joins the projection lens 6 and the main body structure 8; 14, a laser interferometer attached to a column; 18, a wafer; 12, a wafer chuck; 17, a bar mirror; 13, a θ-z-tilt stage; 15, an x-y stage; and 25, a stage surface plate. Reference numerals 21 and 22 denote a vibration control/vibration reduction device (to be referred to as a mount hereinafter) for controlling vibrations produced by the stage repulsion force and reducing vibrations from the floor. FIG. 4 illustrates only two mounts, but the main body is normally supported by four or three mounts. Reference numeral 23 denotes a main body support plate that supports the main body via the mounts 21 and 22.

The mechanism of static or dynamic deformation of the main body structure 8 upon stepping of the wafer stage will be explained below with the aid of FIG. 4. When the wafer stage is stepped in the x-direction, the repulsion forces of acceleration and deceleration act on the main body structure 8, and the main body vibrates. In order to quickly control the vibrations, the damping functions of the mounts 21 and 22 operate. When these damping functions ideally operate, alignment measurement or exposure after the stepping can be ideally done. However, in practice, the damping functions suffer variations in units of channels, or the main body structure 8 is pulled, compressed, or bent in the horizontal direction depending on the layout and the like of the mounts 21 and 22, thus producing unwanted dynamic deformation in the main body structure 8. Static deformation includes that arising from the stage position. When the wafer stage is stepped, the barycentric position of the projection exposure apparatus main body varies, and the main body tilts. In order to suppress such tilt and maintain the main body horizontally, the main body support functions of the mounts 21 and 22 operate to apply vertical forces to the main body. As a result, static deformation that depends on the stage position is produced in the main body structure 8. The static deformation is always produced and cannot be prevented unless the main body structure 8 has infinitely high rigidity. As described above, when the wafer stage is stepped, static and dynamic deformations are produced in the main body structure 8, as shown in FIG. 4.

FIG. 5 similarly shows deformation of the main body structure 8 due to thermal factors. Note that in thermal deformation of the main body structure 8, non-steady expansion or shrinkage is produced until the entire apparatus is thermally balanced, and its steady state is maintained when the apparatus is thermally balanced. Hence, when a thermal balance is disturbed by some factors, the deformation state keeps changing until the steady state is reached again. In addition, the heat capacity of the main body structure 8 is large, and the time and time constant required until the steady state is reached are sufficiently longer than those of the above-mentioned static and dynamic deformations produced by the stepping of the stage. Note that thermal factors include: heat generated by exposure light, heat generated upon driving the stages, heat generated by various measurement devices, outlet air from an ULPA (Ultra Low Penetration Air) filter, and the like. In FIG. 5, the temperature distribution of the upper portion of the main body structure 8 has changed due to these factors, and the structure 8 has thermally deformed. Thermal deformation is always produced unless the material of the main body structure 8 has a zero linear expansion coefficient.

As described above, when the main body structure 8 has deformed due to dynamic factors such as vibrations, forces, and the like, and thermal factors, such deformations largely influence the apparatus performance. That is, since the projection lens and laser interferometer are directly attached to the main body structure 8, when the main body structure 8 has deformed, as shown in FIGS. 4 and 5, the relative distance between the optical axes of the projection lens 6 and interferometer 14 changes. Meanwhile, since the position of the wafer stage is servo-controlled, the wafer stage is always aligned to a target position. Hence, even though the measurement result of the laser interferometer is correct, alignment measurement and exposure are done in the presence of position errors since the relative distance between the optical axes of the projection lens 6 and interferometer 14 has changed. When the relative distance between the optical axes of the projection lens 6 and interferometer 14 has changed, a lattice pattern is formed by the wafer stage according to the measurement values of the interferometer 14, i.e., a stage lattice is formed. That problem becomes serious especially when the stage lattice varies while the apparatus is in operation, that is, when the stage lattice upon global alignment is different from that upon step & repeat exposure, or when the stage lattice varies in units of layers. In such a case, a shot is printed at a position different from a shot matrix printed in the previous layers, thus lowering the superposing precision of the apparatus.

As has already been described above, it is impossible to always reduce deformations of the main body structure 8 arising from dynamic and thermal deformations to zero, and measures that are taken to make such deformations closer to zero are not practical since they lead to an increase in apparatus weight and an increase in cost. In view of such problems, in the present invention, deformation of the main body structure 8 is measured in real time, and stage lattice and alignment precision errors are corrected using the relationship between the deformations and stage lattice errors or alignment measurement errors determined in advance by experiments, numerical simulations, and the like based on the measured value.

Figure 2:
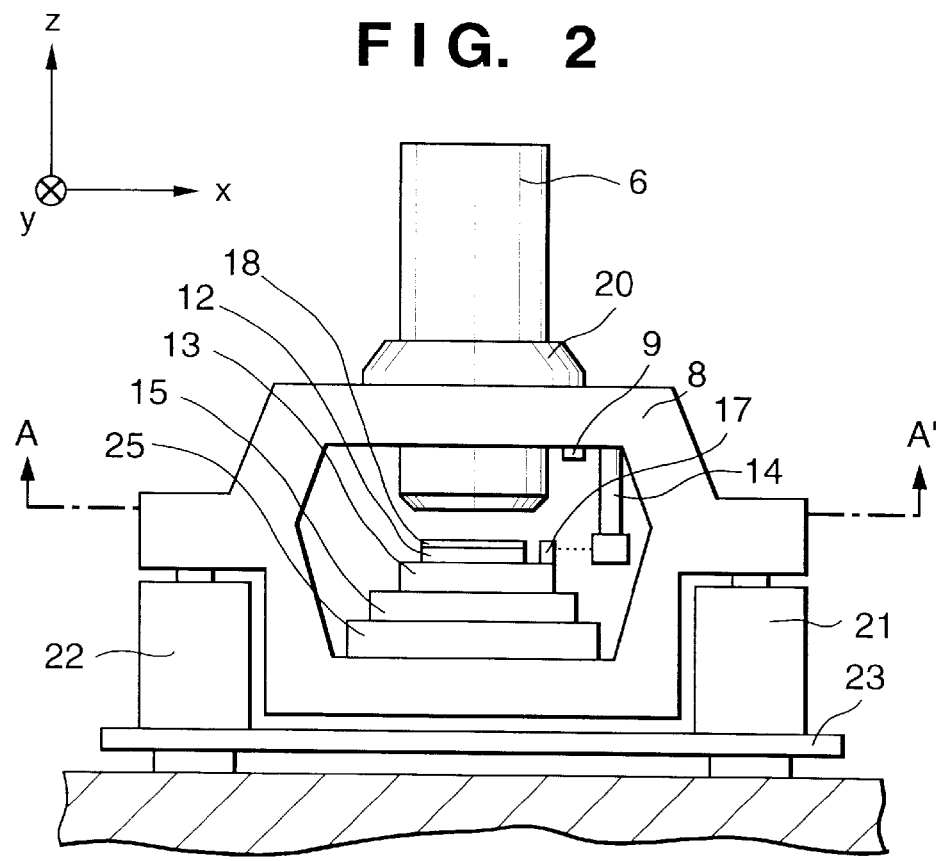
FIG. 2 is a front view showing a state wherein a strain gauge, which is important in the present invention, is adhered to a main body structure of the apparatus shown in FIG. 1.
Figure 3:
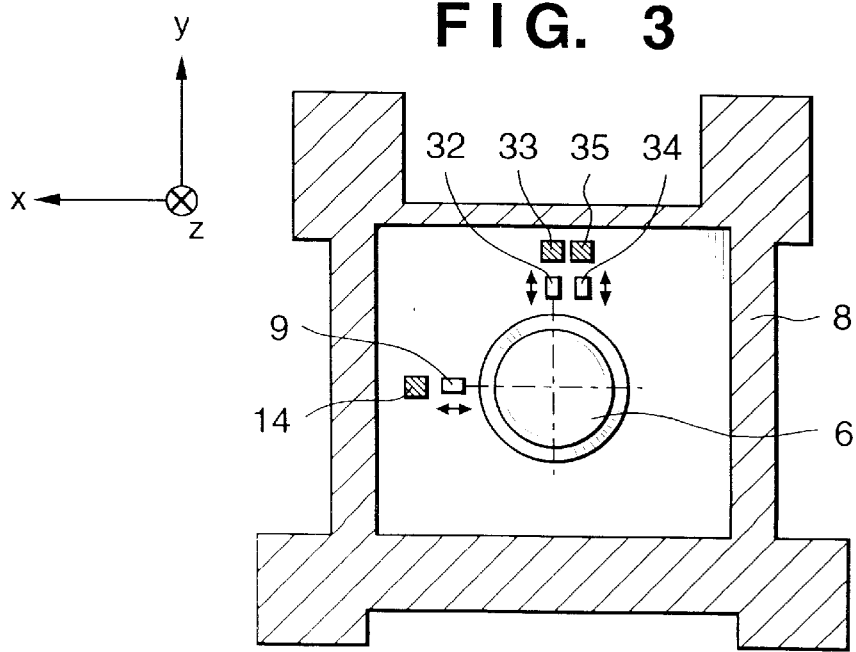
FIG. 3 is a sectional view taken along a line A–A' of FIG. 2 when viewed from the -z direction.

FIGS. 2 and 3 depict the state wherein sensors for measuring the deformation state of the main body structure 8, e.g., strain gauge sensors are adhered to the main body structure 8. FIG. 2 is a front view as in FIGS. 4 and 5, and FIG. 3 is a sectional view taken along a line A–A' in FIG. 2, when viewed from the -Z direction. In these figures, reference numerals 14 and 33 respectively denote x- and y-interferometers; and 35, a yaw interferometer used in yaw control of the stage. Reference numerals 9, 32, and 34 denote strain gauges which are respectively attached between the respective interferometers and the projection lens 6. The gauges are attached to these positions because changes in relative distance between the optical axes of the x- and y- interferometers 14 and 33 and yaw interferometer 35, and the optical axis of the projection lens 6 are in question. The strain gauge 9 measures the x-component of strain of the main body structure 8 between the x-interferometer 14 and projection lens 6; the strain gauge 32, the y-component of strain of the main body structure 8 between the y-interferometer 33 and projection lens 6; and the strain gauge 34, the y-component of strain of the main body structure 8 between the yaw interferometer 35 and projection lens 6. With such a layout of the strain gauges, deformation of the main body structure 8, especially, deformations between the respective interferometers and projection lens can be adequately measured.

A method of obtaining the relationship between the deformations and stage lattice errors, i.e., main body deformation influence coefficients A (Ax, Ay, Aθ), by experiments, numerical simulations, or the like will be briefly explained below. Note that Ax, Ay, and Aθ are coefficients, which respectively represent the relationships between the strain of the main body, and errors in the x-, y-, and shot rotation directions in the wafer.

Since the main body deformation influence coefficients A represent the relationship between the strain produced by deformation of the main body, and stage lattice errors, a method of acquiring print data while giving mechanical deformations to the main body by some method is used in practice. The outputs from the respective strain gauges in a thermally equilibrated state while the wafer stage is located immediately below the projection lens are used as reference outputs (to be referred to as reference strains hereinafter). Let $\Delta\epsilon_{expo.}$ be the change amount between the reference strain and strain produced in the structure when mechanical deformation is given to the main body structure 8 by experiments, that is $$\Delta\varepsilon_{expo.} = \begin{bmatrix} \delta\varepsilon_{11} & \delta\varepsilon_{12} & \delta\varepsilon_{13} \\ \vdots & \vdots & \vdots \\ \delta\varepsilon_{n1} & \delta\varepsilon_{n2} & \delta\varepsilon_{n3} \end{bmatrix}$$

Print data obtained simultaneously with the strain is processed to extract only stage lattice error components $Data_{expo.}$ ($\Delta X_{expo.}$, $\Delta Y_{expo.}$, $\Delta\theta_{expo.}$) that have varied due to the main body deformation.

$$Data_{expo.} = \begin{bmatrix} \Delta X_{expo.} \\ \Delta Y_{expo.} \\ \Delta\theta_{expo.} \end{bmatrix}$$

$$\Delta X_{expo.} = \begin{bmatrix} \delta X_1 \\ \vdots \\ \delta X_m \end{bmatrix}, \quad \Delta Y_{expo.} = \begin{bmatrix} \delta Y_1 \\ \vdots \\ \delta Y_m \end{bmatrix}, \quad \Delta\theta_{expo.} = \begin{bmatrix} \delta\theta_1 \\ \vdots \\ \delta\theta_m \end{bmatrix}$$

For n=3 m.

Since errors produced by microscopic deformation of the main body structure 8 are in question, these two variables $Data_{expo.}$ and $\Delta\epsilon_{expo.}$ can be assumed to have a linear relationship. Using the main body deformation influence coefficients A (Ax, Ay, Aθ) as those for such linear equation, we have $$Data_{expo.} = \Delta\epsilon_{expo.} \cdot A + Err_{expo}$$

where $Err_{expo}$ is random errors.

Hence, the main body deformation influence coefficients A that can minimize $Err_{expo}$ can be obtained from this formula using the method of least squares.

In the above description, the influence coefficients are obtained by the method of acquiring print data while giving mechanical deformation by some method. Likewise, these coefficients can be obtained by other experimental methods or numerical simulations. For example, a method of giving mechanical deformation to the main body while observing the mark on the wafer using the measurement system (alignment scope) 5 may be used. Let $Data_{a.s.}$ ($\Delta X_{a.s.}$, $\Delta Y_{a.s.}$, $\Delta\theta_{a.s.}$) be error components due to the deformation, which can be calculated from data obtained by the observation result, and $\Delta\epsilon_{a.s.}$ be the main body strain at that time. Then, these two variables satisfy the following relation via the main body deformation influence coefficients A (Ax, Ay, Aθ):

$$Data_{a.s.} = \Delta\epsilon_{a.s.} \cdot A + Err_{a.s.}$$

Hence, as in the above-mentioned method, the main body deformation influence coefficients A (Ax, Ay, Aθ) that can minimize $Err_{a.s.}$ can be obtained from this formula using the method of least squares.

As a method using numerical simulations, strain $\Delta\epsilon_{sim.}$ at the adhered position of the strain gauge, and x- and y-direction magnification rotation error $Data_{sim.}$ ($\Delta X_{sim.}$, $\Delta Y_{sim.}$, $\Delta\theta_{sim.}$) which can be calculated from changes in relative distance between the interferometer optical axes and projection lens optical axes upon applying an imaginary force on an FEM model of the main body structure 8, are calculated. These two variables satisfy the following relation via the main body deformation influence coefficients A (Ax, Ay, Aθ):

$$Data_{sim.} = \Delta\epsilon_{sim.} \cdot A + Err_{sim.}$$

In numerical simulations, since the two variables strictly satisfy a linear relationship, the main body deformation influence coefficients A (Ax, Ay, Aθ) can be immediately obtained without using the method of least squares as long as the boundary conditions upon calculations are correct as compared to practical ones. The methods of calculating the main body deformation influence coefficients A, which are important in the first embodiment of the present invention, have been described.

Figure 6:
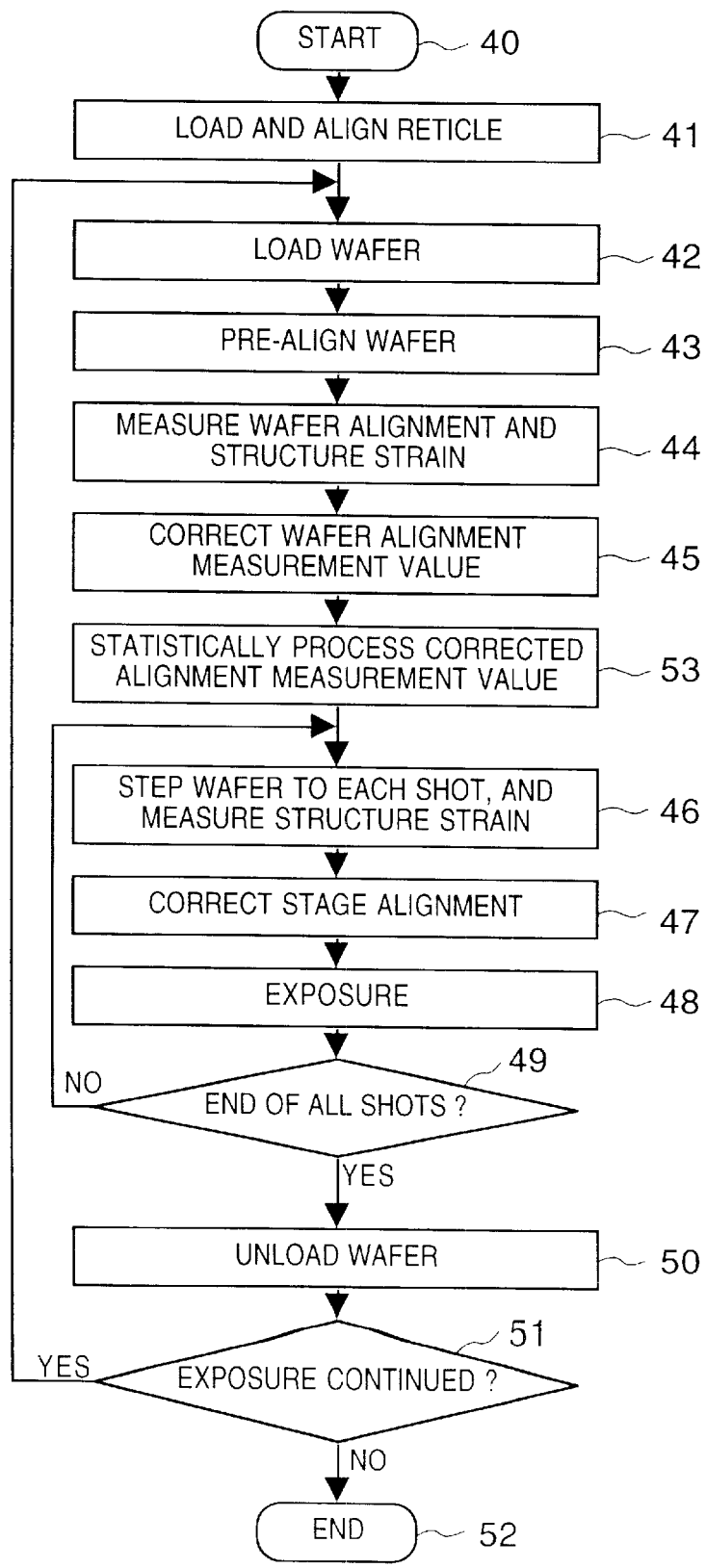
FIG. 6 is a flow chart showing the exposure sequence in the apparatus shown in FIG. 1 to which the present invention is applied.

The exposure sequence to which the first embodiment of the present invention is applied will be described below with reference to FIG. 6. When the sequence is started (step 40), a reticle is loaded onto the reticle stage. The reticle is aligned to the reference mark formed on the reticle stage substrate (step 41). A wafer is then fed onto the stage (step 42), and is pre-aligned (step 43). Subsequently, a main body structure strain measurement as the characteristic feature of the present invention is done simultaneously with a global alignment measurement (to be simply referred to as an alignment measurement hereinafter) (step 44).

In the alignment measurement, several specific shots on the wafer are selected as representative measurement points. The number of measurement shots is four for sub measurements and eight for main measurements, although it depends on processes, or main measurements alone are done while omitting sub measurements. In the first embodiments, eight shots for main measurements alone as the latter case will be examined. In this case, the outputs from the respective strain gauges in a thermally equilibrated state when the wafer stage is located immediately below the projection lens are used as reference outputs (reference strains), and the change amounts from the reference strains produced in the main body structure during the alignment measurement periods of the respective shots are measured. Let $\Delta \epsilon$ ($\delta \epsilon_{i1}$, $\delta \epsilon_{i2}$, $\delta \epsilon_{i3}$, i=1, ..., 8) be the measured strains. Then, error components $\Delta \epsilon \cdot A$ of the alignment measurement values due to the main body deformation can be immediately calculated using the main body deformation influence coefficients A obtained by the above-mentioned methods. The alignment measurement values for eight shots are corrected using these error components $\Delta \epsilon \cdot A$ (step 45). The alignment measurement values corrected in this way are subjected to statistical processing, which is normally done in global alignment, thus calculating the coordinate system that considers the x- and y-components of shift, rotation component, and magnification component of the wafer (step 53). As a matter of course, this coordinate system does not include any components produced by the deformation of the main body structure.

Then, stepping to each shot is done based on this coordinate system. The wafer stage is aligned to the target position of the first shot, and at the same time, strains of the main body structure are measured (step 46). That is, strains $\Delta \epsilon'$ ($\delta \epsilon'_1$, $\delta \epsilon'_2$, and $\delta \epsilon'_3$) of the main body structure, which have been produced immediately before exposure, are measured, and alignment errors $\Delta \epsilon' \cdot A$ due to the deformation of the main body at that shot position are immediately calculated using the main body deformation influence coefficients A. Based on these errors, the alignment target value of the shot of interest is corrected (step S47), thus aligning the wafer stage. After that, the shutter is opened, and a circuit pattern is formed by exposure at a predetermined position (step 48), thus completing exposure for the first shot. Since exposure for all the shots is not complete yet (NO in step 49), exposure for the second shot is started (step 46). The operation for the second shot is made in the same manner as in the first shot. That is, the wafer stage is temporarily aligned to the target position for the second shot calculated in step 53, and strains of the main body structure at that time are measured (step 46). Based on the measurement values, error components $\Delta \epsilon \cdot A$ due to main body deformation are calculated, and the target value is corrected, thus aligning the wafer stage to the position of the second shot (step 47). Then, exposure for the second shot is done (step 48). In this way, steps 46 to 48 are repeated until exposure for all the shots is complete.

Upon completion of exposure for all the shots (YES in step 49), the wafer is unloaded (step 50). If more wafers to be processed remain, exposure continues (YES in step 51). The sequence returns to step 42 to load a new wafer onto the stage again, and a series of processing operations (steps 42 to 50) are repeated. Upon completion of the processing for all the wafers (NO in step 51), the sequence to which the first embodiment of the present invention is applied ends (step 52).

As described above, in the first embodiment, since the strain change amounts of the main body structure are measured simultaneously with global alignment measurement, the correction amounts of the alignment measurement values are calculated from the main body deformation influence coefficients A to correct the measurement values, the respective shot coordinate positions are calculated by statistical processing on the basis of the corrected alignment measurement values, and the wafer stage is moved to each shot position based on the calculated coordinate position. In addition, upon alignment as well, since the strain change amounts of the main body structure are measured, the correction amounts of the respective shot positions are calculated from the main body deformation influence coefficients A, and the shot positions are corrected. In this way, since errors produced by main body deformation are corrected in two steps, i.e., at the times of global alignment measurement and alignment to each shot position, the matrix precision of the wafer stage can be improved, and high superposing precision can be maintained.

<Second Embodiment>

Figure 9:
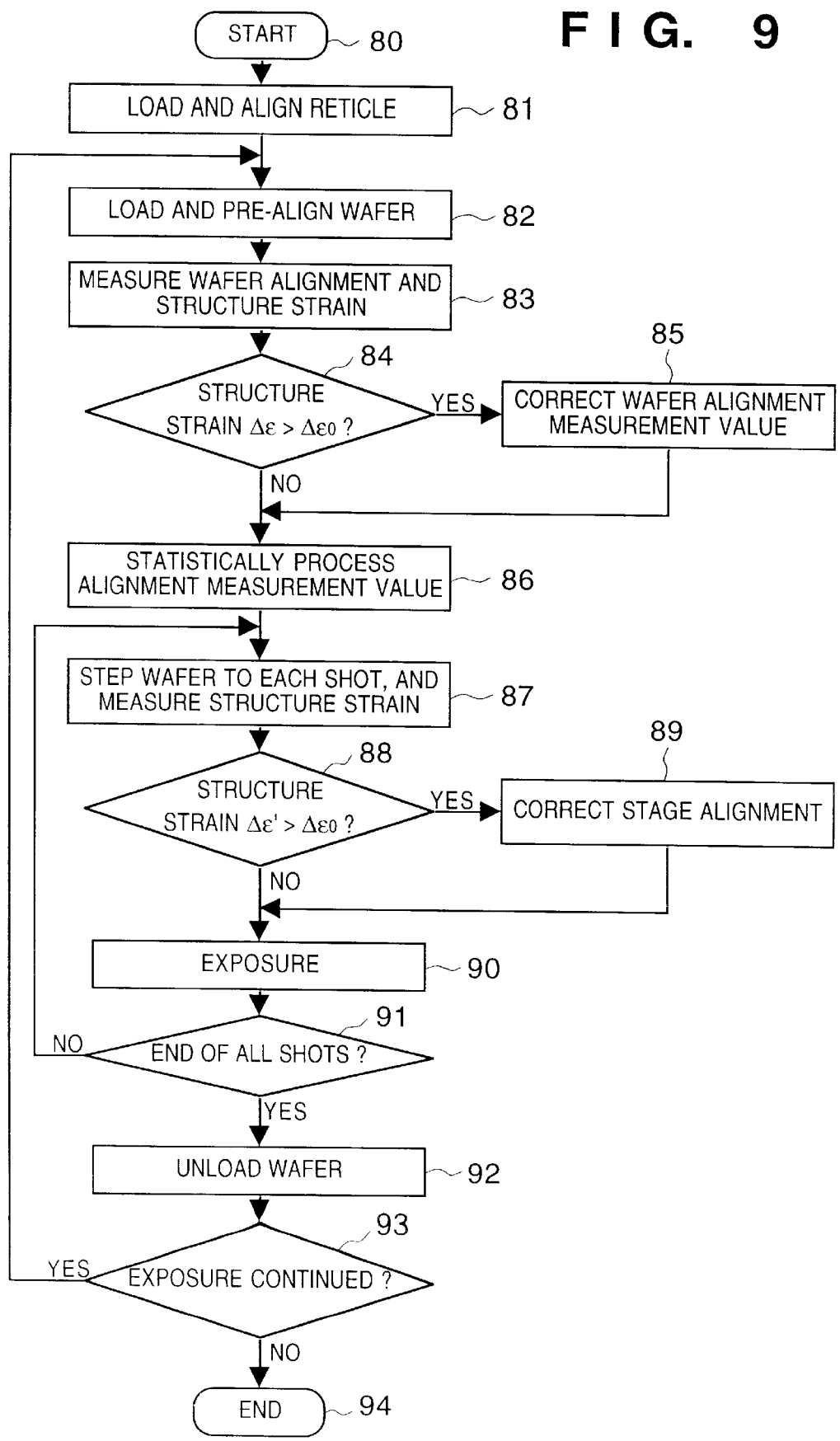
FIG. 9 is a flow chart showing the exposure sequence according to the second embodiment of the present invention.

The second embodiment is characterized in that correction is done only when the monitored strains of the main body structure have exceeded a predetermined value in the exposure sequence described in the first embodiment. The exposure sequence of this embodiment will be explained below with reference to FIG. 9.

When the sequence is started (step 80), a reticle is loaded onto the reticle stage. The reticle is aligned to the reference mark formed on the reticle stage substrate (step 81). A wafer is then fed onto the stage, and is pre-aligned (step 82). Subsequently, a main body structure strain measurement as the characteristic feature of the present invention is done simultaneously with a global alignment measurement (to be simply referred to as an alignment measurement hereinafter) (step 83). These steps are the same as those in the first embodiment.

In the second embodiment, an allowable maximum strain $\Delta \epsilon_0$ at each strain measurement position of the main body structure, which is allowed for alignment precision and stage lattice errors, is calculated in advance. If the output from each strain gauge has become larger than the strain $\Delta \epsilon_0$, the alignment measurement precision and stage lattice precision exceed the specifications of the apparatus.

It is checked in step 84 if the measured strain $\Delta \epsilon$ is larger than the allowable maximum strain $\Delta \epsilon_0$. If the measured strain is smaller than the allowable maximum strain (NO in step 84), the alignment measurement values are subjected to normal statistical processing in step 86 without being corrected, thus calculating the coordinate positions of the respective shots in the wafer. By contrast, if the measured strain $\Delta\epsilon$ is larger than the allowable maximum strain $\Delta\epsilon_0$(YES in step 84), the alignment measurement values are corrected using error components $\Delta\epsilon \cdot A$ due to main body deformation, as in the first embodiment. Using the corrected alignment measurement values, the coordinate values of the respective shots are statistically calculated (step 86).

Then, stepping to each shot is effected based on this coordinate system. The wafer stage is aligned to the target position of the first shot, and at the same time, strains of the structure are measured (step 87). It is checked in step 88 if the measured strain $\Delta\epsilon'$ is larger than the allowable maximum strain $\Delta\epsilon_0$. If the measured strain is smaller than the allowable maximum strain (NO in step 88), exposure is done without changing the current stage target position (step 90). Conversely, if the measured strain $\Delta\epsilon'$ is larger than the allowable maximum strain $\Delta\epsilon_0$ (YES in step 88), the stage target position is corrected using error components $\Delta\epsilon' \cdot A$ due to main body deformation, as in the first embodiment, and exposure is done at the corrected coordinate position (step 90).

Since exposure for all the shots is not complete yet (NO in step 91), exposure for the second shot is started (step 87). The operation for the second shot is made in the same manner as in the first shot. In this way, steps 87 to 90 are repeated until exposure for all the shots is complete.

Upon completion of exposure for all the shots (YES in step 91), the wafer is unloaded (step 92). If more wafers to be processed remain, exposure continues (YES in step 93). The sequence returns to step 82 to load a new wafer onto the stage again, and a series of processing operations (steps 82 to 92) are repeated. Upon completion of the processing for all the wafers (NO in step 93), the sequence to which the present invention is applied ends (step 94).

In the second embodiment, the allowable maximum strain $\Delta\epsilon_0$ at each strain measurement position of the main body structure, which is allowed for alignment precision and stage lattice errors, is calculated in advance, and in actual exposure, when the output from each strain gauge is larger than $\Delta\epsilon_0$, correction calculations are made; otherwise, conventional processing is done. With this sequence, the throughput can be improved at slight cost of superposing precision.

<Third Embodiment>

Figure 7:
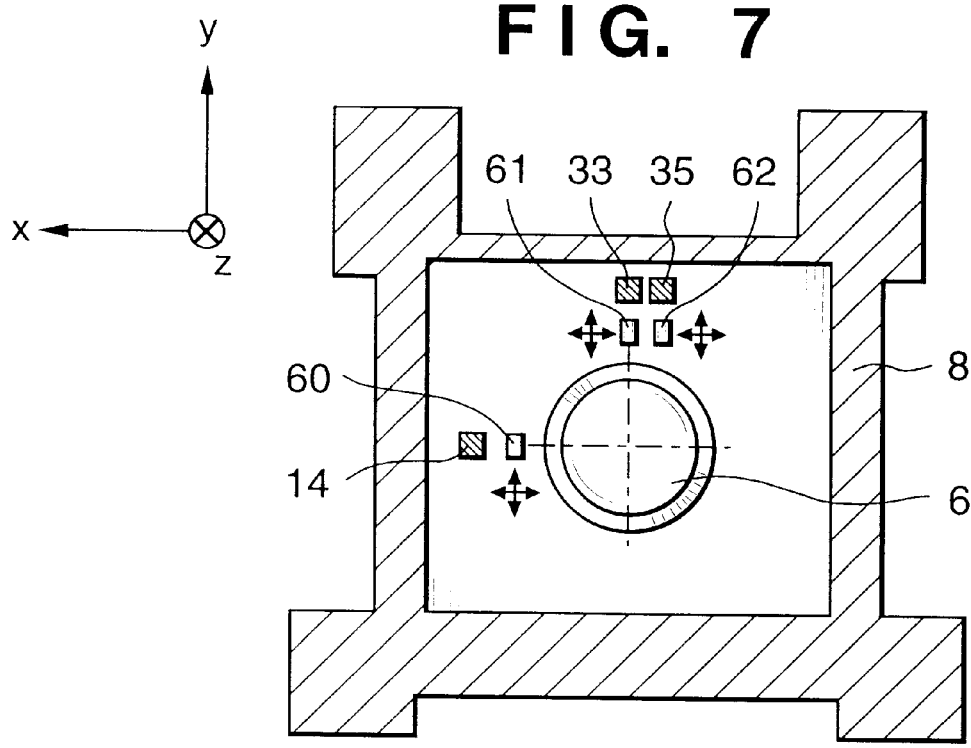
FIG. 7 is a sectional view showing a state wherein a strain gauge, which is important in the present invention, is adhered to a main body structure in the third embodiment of the present invention.

In the third embodiment, it is important to recognize the relationship between deformation (strain) produced in the main body structure, and stage lattice errors in advance. Hence, as long as the relationship between deformation produced in the main body structure, and stage lattice errors can be recognized, the number and positions of strain gauges to be adhered to the main body are not particularly limited. In the third embodiment, the number and positions of strain gauges to be adhered are different from the first and second embodiments in consideration of its feature. FIG. 7 is a sectional view showing the state of strain gauges adhered to the main body structure, as in FIG. 3. In the first embodiment, the strain gauges 9, 32, and 34 are adhered between the respective interferometers and the projection lens to measure the x- and y-components of strain, and the y-component of strain between the yaw interferometer 35 and the main body structure 8. However, the three strain gauge outputs cannot often satisfactorily express stage lattice error variations, or main body deformation influence coefficients A with higher precision need often be obtained. Hence, in the third embodiment, each strain gauge between one interferometer and projection lens measures along two axes, i.e., x- and y-directions. In FIG. 7, reference numerals 60, 61, and 62 denote strain gauges, each of which can measure in the x- and y-directions.

Figure 8:
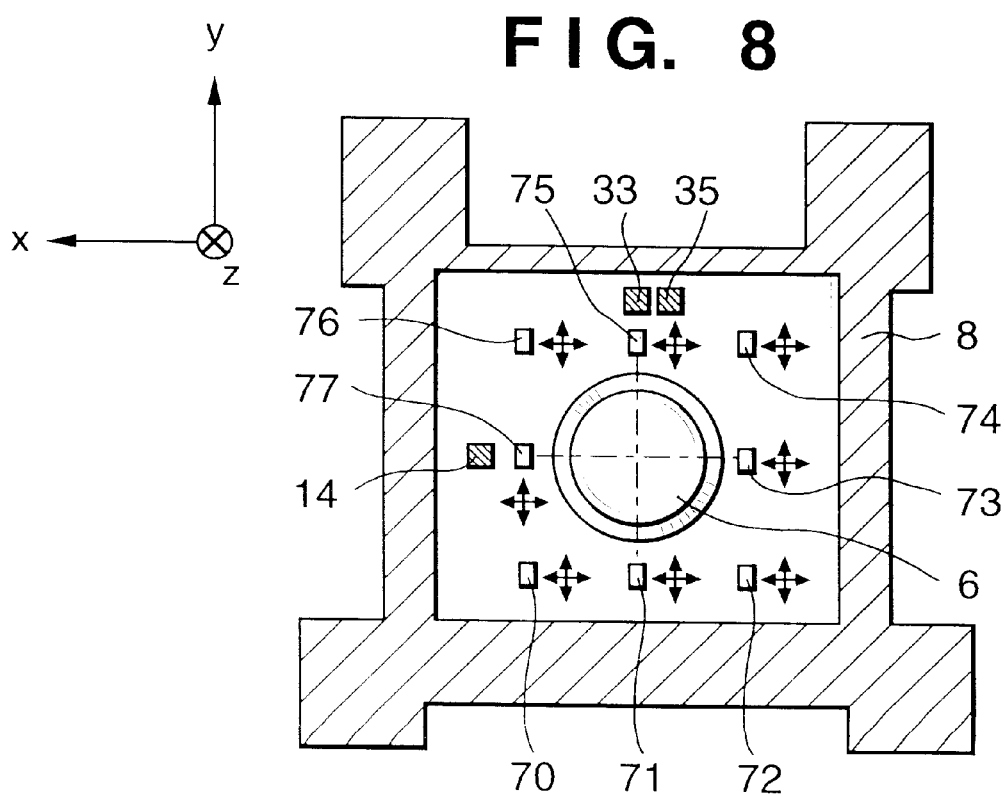
FIG. 8 is a sectional view showing another state wherein a strain gauge, which is important in the present invention, is adhered to a main body structure in the third embodiment of the present invention.

Similarly, FIG. 8 shows the case wherein strain gauges are evenly adhered to eight positions to the main body structure surface plate around the projection lens without sticking to the adhesion positions between the respective interferometers and projection lens. Each of strain gauges 70 to 77 has a two-axis arrangement (x and y), and can measure in the x- and y-strains. Such an arrangement is used to always monitor strains of the entire surface of the main body structure surface plate, and to cope with a case wherein main body strain other than those at positions between the respective interferometers and projection lens largely influences stage lattice errors.

The calculation method of main body deformation influence coefficients A in such a case is the same as that in the first embodiment, and the coefficients can be calculated using any of print data, scope data, and numerical simulation. Using the obtained main body deformation influence coefficients A, exposure is made according to the exposure sequence shown in FIG. 6 or 9. As described above, each strain gauge has a two-axis arrangement to measure strains between the projection lens and interferometer, or to measure strains of the entire surface of the main body structure surface plate, main body deformation influence coefficients A with higher precision can be calculated, and high superposing precision can be realized.

As described above, it is important in the present invention to recognize the relationship between deformation (strain) produced in the main body structure, and stage lattice errors in advance. Hence, as long as the relationship between deformation produced in the main body structure, and stage lattice errors can be recognized, the number and positions of strain gauges to be adhered to the main body are not particularly limited. Therefore, various patterns other than those in the third embodiment can be used.

As described above, according to the first to third embodiments of the present invention, since the substrate is aligned under drive control of the stages in consideration of strains of the main body structure, accurate alignment can be attained irrespective of strains of the main body structure.

More specifically, since the strain gauges are adhered to a plurality of positions of the main body structure to recognize in advance the relationship between deformations (strains) produced in the main body structure, and alignment errors or stage lattice errors, deformations (strains) of the main body structure are monitored in the actual exposure sequence to correct measurement errors due to the deformations of the main body structure produced upon global alignment, and to correct stage alignment errors due to deformations of the main body structure produced upon step & repeat exposure, thus realizing high superposing precision without being influenced by dynamic and thermal deformations of the structure. Furthermore, whether or not correction is made may be determined depending on the magnitudes of strains produced in the main body structure, so as to give priority to throughput over precision. When the present invention is used, an importance need not be placed on high rigidity of the structure, and an increase in weight of the structure can be suppressed. The present invention can be relatively easily practiced by attaching only strain gauge sensors and modifying measurement control system software without requiring large changes in design.

<Fourth Embodiment>

The fourth embodiment of the present invention focuses on deformations caused by the functions of a vibration reduction device, and even when the main body structure has deformed, the deformations are measured to attain adequate correction based on the measurement result without impairing the functions of the vibration reduction device. In this way, high superposing precision is realized without being influenced by any variations in support force of the vibration reduction device.

More specifically, in the fourth embodiment, a sensor that can measure the force that the vibration reduction device exerts on the structure is attached to measure that force. The applied force is always monitored to recognize in advance the relationship between changes in applied force and alignment errors or stage lattice errors by experiments, numerical simulations, or the like, and the measurement values of alignment measurement sensors and stage position measurement sensors are corrected based on that relationship. The sensor that can measure a force may comprise a pressure gauge or load cell when the vibration reduction device uses a pneumatic spring as an actuator.

Using the above-mentioned means, the force that the vibration reduction device exerts on the main body structure is measured, and alignment errors or stage lattice errors caused by that force can be predicted. Hence, high superposing precision can be maintained without impairing the functions of the vibration reduction device independently of deformations of the main body structures. As the stage moving speed becomes higher, the force that the vibration reduction device imposes on the main body increases. However, in this embodiment, since this force is always monitored, and error components can be predicted, the throughput can be improved while maintaining high superposing precision. Furthermore, when the means of this embodiment is used, as the performance required for the structure places an importance not on high rigidity but on high reproducibility, the weight can be prevented from being unnecessarily increased.

In the fourth embodiment, the application force that each mount exerts on the main body structure, and the application force upon upward movement of the stage are measured in real time, and the relationship between the pressure and stage position errors or alignment measurement errors is obtained in advance by experiments, numerical simulations, or the like, thereby correcting stage lattice or alignment precision errors in real time.

Note that each mount of the fourth embodiment uses compressed air as an energy source, and realizes a vibration reduction function by feedback-controlling the internal pressure of a pneumatic spring actuator based on, e.g., the acceleration of the main body.

In the fourth embodiment, a shot matrix free from the influences of variations in mount pressure can be obtained by an error estimation method of the present invention in the process of 1st layer exposure. In exposure operations for the 2nd layer and subsequent layers, alignment measurement values are corrected by a similar error estimation method upon global alignment measurement. The corrected alignment measurement values are subjected to normal statistical processing to calculate target coordinate positions of the respective shots. Movement to each shot position is made based on the calculated coordinate position. In such alignment as well, since the forces applied to the main body are measured, the correction amount of each shot position is always calculated by the error estimation method of the present invention, and the shot position is corrected. In this fashion, since errors produced by variations in force applied to the main body are always corrected in the processes of shot alignment for the 1st layer, global alignment measurement for the 2nd layer and subsequent layers, and alignment for each shot position, the matrix precision of the wafer stage can be improved, and high superposing precision can be maintained.

As a modification of the fourth embodiment, the wafer stage moving speed may be increased for the purpose of improving the throughput. As the acceleration of the wafer stage becomes larger, the repulsion force that the stage applies to the main body also increases, and the force that each mount applies to the main body increases so as to control vibrations of the main body. For these reasons, the main body structure is expected to deform. In such a case, in the fourth embodiment, large variations in mount pressure in the processes of wafer operations, i.e., in the processes of each shot alignment and alignment measurement, are measured, and error components caused by such variations can be predicted. In this way, the throughput can be greatly improved while maintaining high superposing precision of the apparatus.

As described above, according to the fourth embodiment, since the relationship among the mount pressure, alignment errors, and stage alignment errors, that may deform the main body structure, is obtained in advance, each mount pressure is monitored in the actual exposure sequence to correct measurement errors due to the deformations of the main body structure produced upon global alignment, and to correct stage alignment errors due to the deformations of the main body structure produced upon step & repeat exposure, thus providing an exposure apparatus which is free from any influences of mount pressure variations and has high superposing precision.

According to the fourth embodiment of the present invention, since an importance need not be placed on high rigidity of the main body structure, an increase in weight of the structure can be prevented. The present invention can be relatively easily practiced by attaching only strain gauge sensors and modifying measurement control system software without requiring large changes in design.

In the following fifth to ninth embodiments, stage position measurement errors, alignment measurement errors, and focus measurement errors are predicted and corrected using a vector obtained by measuring principal forces acting on the main body structure or physical quantities proportional to them, and any one of the measurement value of a load cell for measuring the support force of a support base, the measurement value of the pressure of a pneumatic spring when a pneumatic spring type vibration reduction mechanism is provided to a contact with the support base, and the measurement value of a strain gauge arranged near a contact with the support base, and multiplying these measurement values by an appropriate coefficient matrix.

This arrangement can realize a semiconductor exposure apparatus almost free from the influence of deformation of the main body structure. This is because even when the attachment position of a focus measurement device for measuring the position and posture of a wafer surface shifts owing to elastic deformation of the main body structure arising from changes in forces for supporting the main body structure or forces for controlling vibrations of the main body structure, principal forces acting on the main body structure which cause the shift are always measured to calculate and correct measurement errors caused by the shift in real time in an exposure apparatus (so-called a stepper) for sequentially projecting and forming an electronic circuit pattern on a reticle surface onto a wafer surface by step & repeat exposure via a projection optical system in the manufacture of semiconductor elements such as ICs, LSIs, and the like, or an exposure apparatus (so-called a scanner)

for similarly sequentially projecting and forming an electronic circuit pattern on a reticle surface onto a wafer surface by step & scan exposure via a projection optical system.

Figure 10:
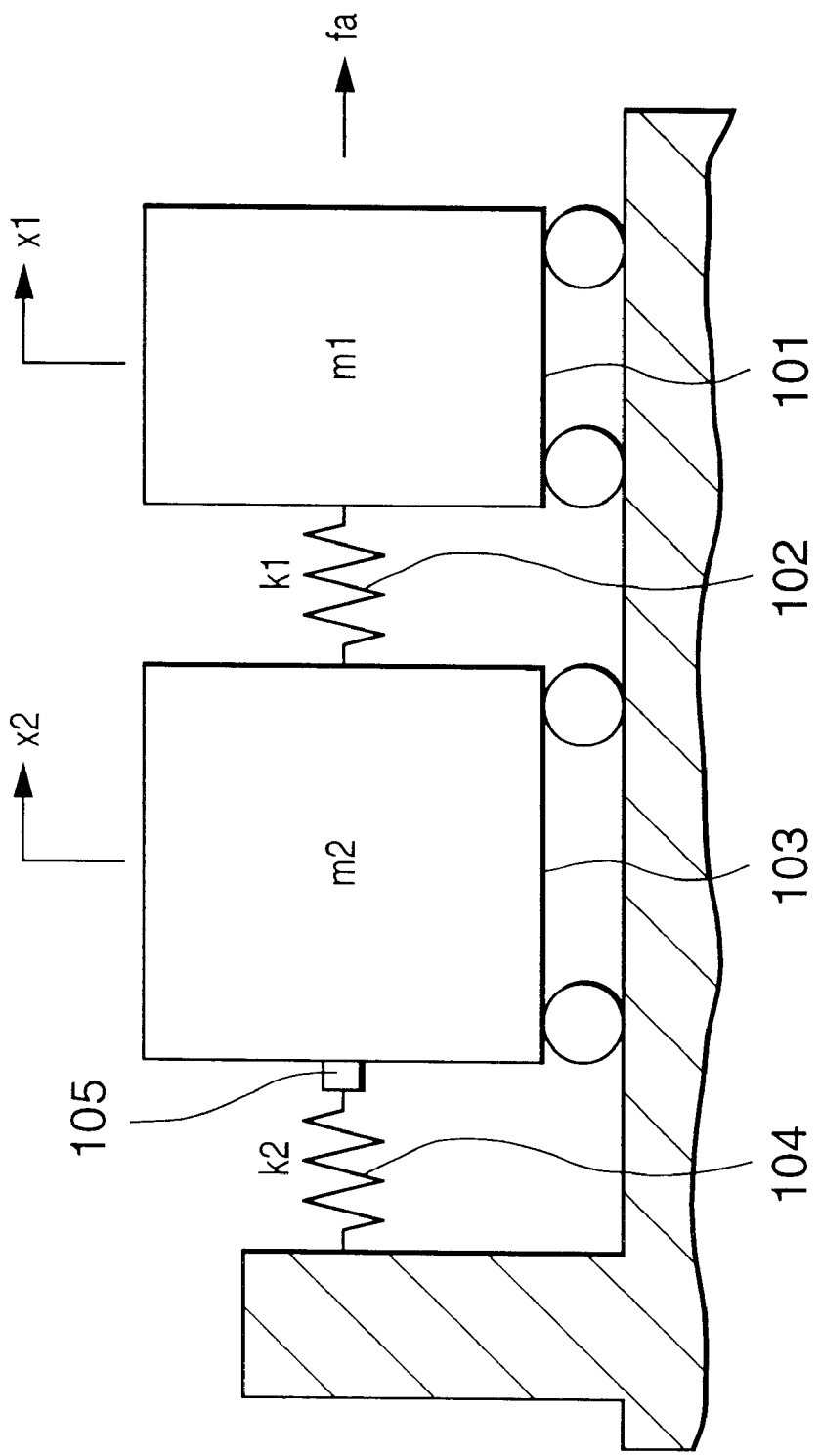
FIG. 10 is a front view for explaining the principles of the present invention.

The principle of the present invention will be explained briefly. FIG. 10 shows a model in which a main body structure expressed by a model obtained by sandwiching an elastic structure spring 102 having rigidity k1, which represents deformation inside the main body structure, between a mass point 1 having a mass m1 and a mass point 2 having a mass m2 is supported by a load cell 105 and an elastic support base spring 104 having rigidity k2.

Assuming a force $f_a$ acting on the mass point 1 as an external force corresponding to the repulsion force of the stage, the motion equation of this model is given by $$m_1\ddot{x}_1 + k_1(x_1 - x_2) = f_a \qquad (1)$$

$$m_2\ddot{x}_2 - k_1(x_1 - x_2) + k_2 x_2 = 0 \qquad (2)$$

Equations (1) and (2) are solved to obtain a vibration equation having two vibration modes. Since $k_2 x_2$ corresponding to a main body structure support force is measured by the load cell 105, the measurement value is represented by $f_b = -k_2 x_2$ to rewrite equation (2) into $$m_2\ddot{x}_2 - k_1(x_1 - x_2) = f_b \qquad (2')$$

$$If (1)\_m_2 - (2)\_m_1 m_2 (\ddot{x}_1 - \ddot{x}_2) + (m_1 + m_2) k_1 (x_1 - x_2) = m_2 f_a + m_1 f_b \qquad (3)$$

The two sides are divided by $m_1 m_2$ into $$(\ddot{x}_1 - \ddot{x}_2) + \frac{(m_1 + m_2)k_1}{m_1 m_2}(x_1 - x_2) = \frac{f_a}{m_1} + \frac{f_b}{m_2} \qquad (3')$$

As a result, $(x_1 - x_2)$ represents forced vibrations having a minimum-degree natural frequency ω unique to the structure:

$$\omega = \sqrt{\frac{(m_1 + m_2)k_1}{m_1 m_2}} \qquad (4)$$

If the minimum-degree natural frequency ω is set satisfactorily high by increasing the rigidity of the main body structure, the influence of resonance can be removed by short-time averaging in alignment measurement or focus measurement using the mean value of measurement data.

If the minimum-degree natural frequency ω is set much higher than the stage control frequency band, the influence of resonance on the structure can be avoided because, even if the influence of resonance appears in a stage position measurement value, stage control cannot respond to this.

Since inertia terms can be ignored in a region where the frequency is lower than the minimum-degree natural frequency ω, equation (3') cam be rewritten into $$(x_1 - x_2) = \frac{m_1 m_2}{(m_1 + m_2)k_1}\left(\frac{f_a}{m_1} + \frac{f_b}{m_2}\right) \qquad (5)$$

Accordingly, in a main body structure not using any flexible support mechanism such as a mount, the distance between two arbitrary points on the main body can be represented by the linear sum of all forces acting on the structure within the range up to the minimum-degree natural frequency unique to the structure.

More specifically, the distance between the two points of the projection lens and stage position measurement device, the distance between the two points of the projection lens and alignment scope, the distance between the two points of the projection lens and focus measurement device, and the like can be predicted by the linear sum of all forces acting on the structure.

However, an accurate linear sum expression, i.e., an accurate coefficient matrix must be estimated.

To meet this demand, a method of estimating such a coefficient matrix will be described in detail.

Irregular variations in support forces independent of each other, e.g., forced variations caused by white noise or sine wave sweep are applied to all support points for supporting the main body structure. The variations in support forces or physical quantities proportional to them, and the measurement values of the stage position measurement device and alignment scope or the stage position measurement device and focus measurement device are simultaneously recorded.

For example, the measurement value of the focus measurement device is given by the measurement value of a z-tilt sensor as part of the stage position measurement device and the elastic deformation component of the main body structure:

$$Dx + dx = Dx_0 + dx_0 + A(F_e + f_e) + dx_e + C \qquad (6)$$

where

Dx: column vector representing the mean of measurement values of the focus measurement device dx: column vector representing variations in measurement values of the focus measurement device $Dx_0$: column vector representing the mean of measurement values of the z-tilt sensor $dx_0$: column vector representing variations in measurement values of the z-tilt sensor A: coefficient matrix $F_e$: mean value of column vectors representing main body structure support forces or physical quantities proportional to them $f_e$: variations in column vectors representing main body structure support forces or physical quantities proportional to them $dx_e$: another error C: offset value.

Constant terms are subtracted from the two sides of equation (6) to obtain $$dx - dx_0 = Af_e + dx_e \qquad (7)$$

At this time, the coefficient matrix estimate A is obtained to minimize the sum of squares of the correction residual $dx_e$.

More specifically, the estimate A can be obtained using a pseudo inverse matrix:

$$A = (dx - dx_0)pinv(f_e) \qquad (8)$$

where pinv(*) is the pseudo inverse matrix.

The relative error between a stage position measurement value and focus measurement device caused by elastic deformation of the main body structure can be removed by a correction vector calculated from the product of the obtained coefficient matrix A and the column vector representing a main body structure support force which is always measured or a physical quantity proportional to it.

Note that correction cannot be accurately done if measurement of the main body structure support force or physical quantity proportional to it, and measurement of the z-tilt sensor or focus measurement have a timing difference. For this reason, these measurements are simultaneously done.

The present invention can remove, by correction, variations in stage position measurement errors, variations in alignment measurement errors, and variations in focus measurement errors, which are caused by changes in force for supporting the main body structure or controlling vibrations and changes in the stage drive force. Hence, high-reproducibility measurement can be realized without increasing the rigidity of the main body structure.

As a matter of course, the offset values of stage position measurement errors, alignment measurement errors, and focus measurement errors cannot be removed by only an application of the present invention. However, these offset values can be removed by adjustment based on performance evaluation tests.

Embodiments of the present invention will be described below with reference to the accompanying drawings.

<Fifth Embodiment>

Figure 11:
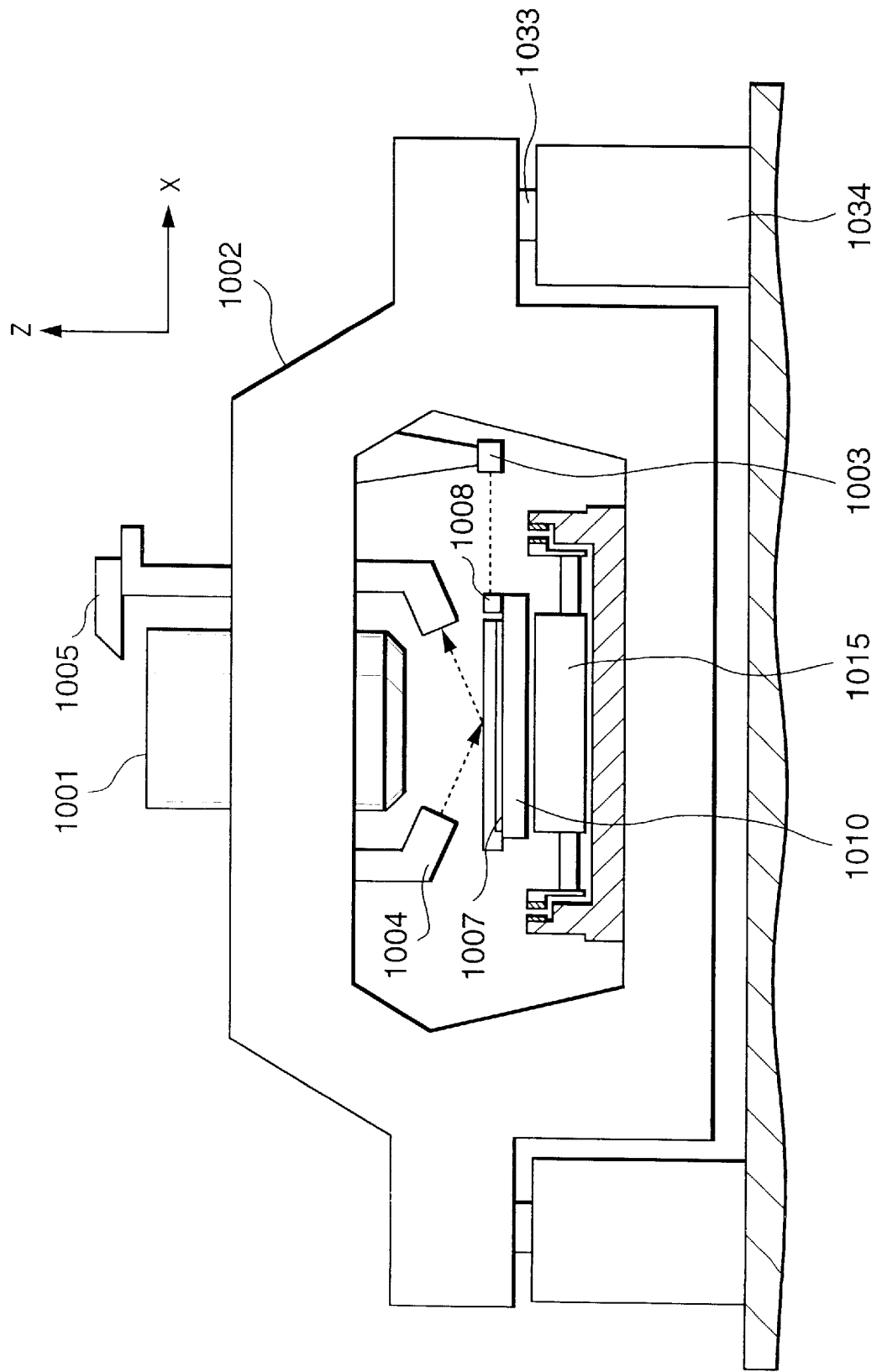
FIG. 11 is a front view for explaining correction of focus measurement errors in a semiconductor exposure apparatus according to the fifth embodiment of the present invention.
Figure 12:
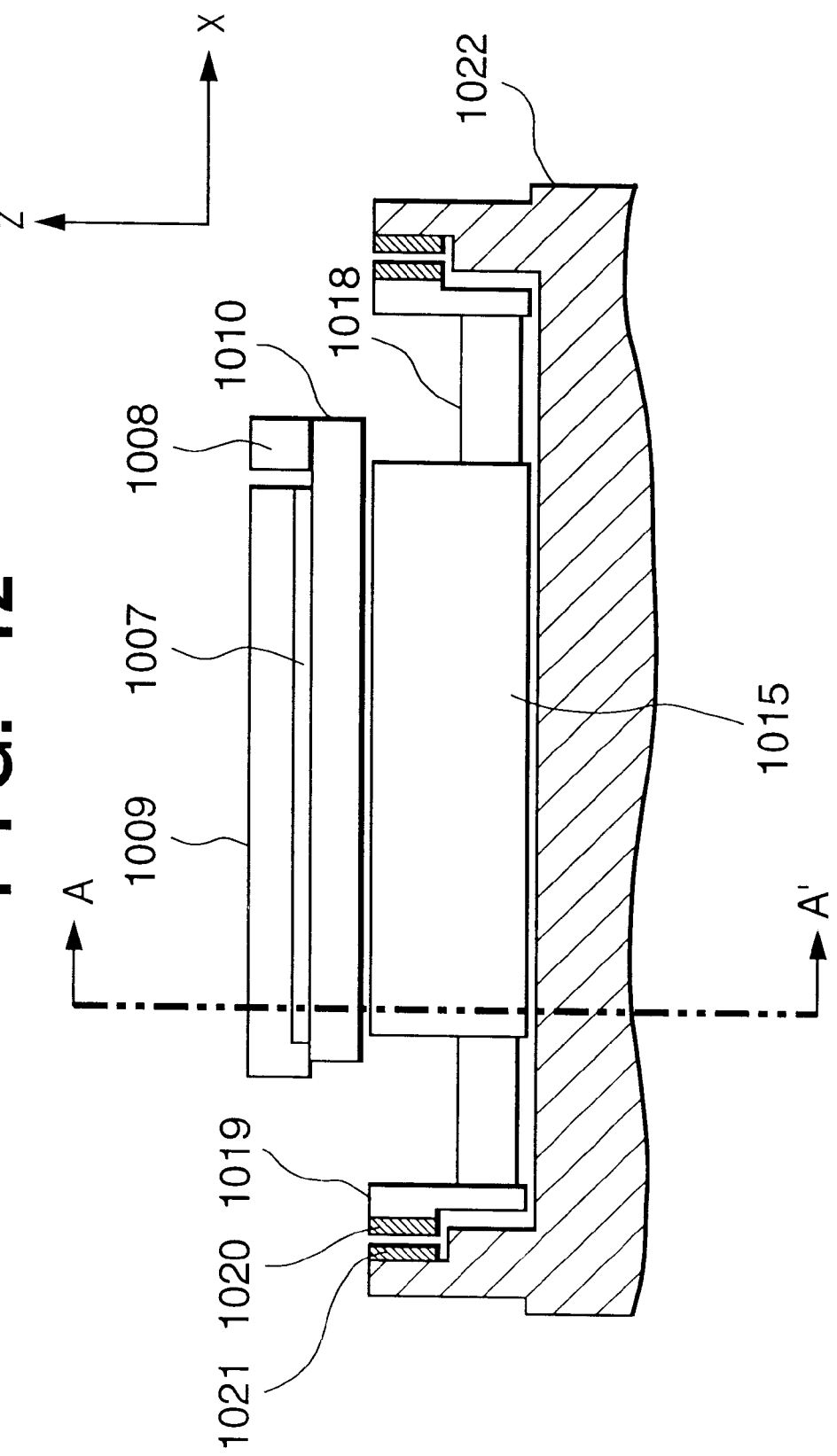
FIG. 12 is a front view showing the stage of the semiconductor exposure apparatus in FIG. 11.
Figure 13:
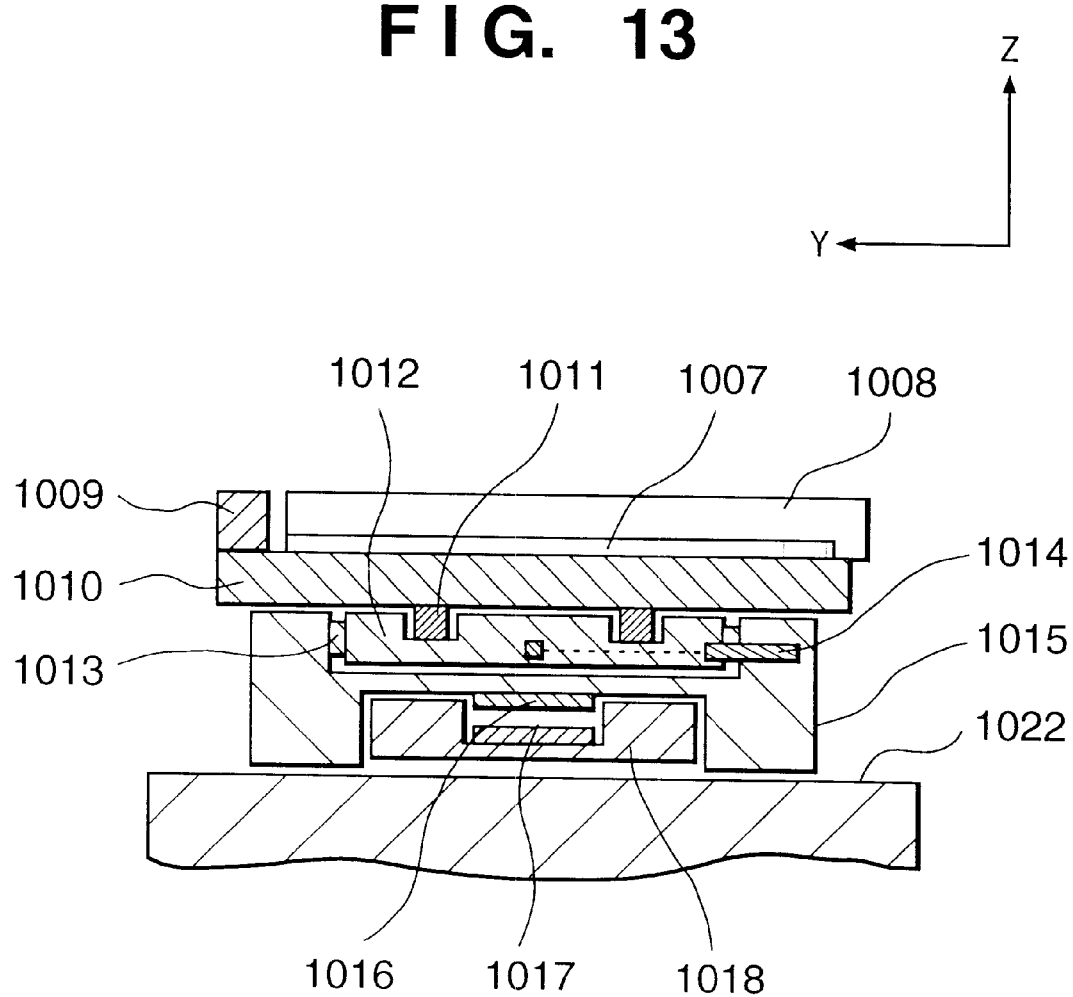
FIG. 13 is a sectional view showing the stage of the semiconductor exposure apparatus in FIG. 11.

In the fifth embodiment shown in FIGS. 11, 12, and 13, the present invention is applied to correction of focus measurement errors in the projection exposure apparatus.

FIG. 11 shows the whole arrangement of a projection exposure apparatus according to the fifth embodiment. In FIG. 11, reference numeral 1001 denotes a projection lens; 1002, a main body structure; 1003, a wafer stage laser interferometer; 1004, a focus measurement device; 1007, a wafer; 1008, an x-axis laser interferometer mirror; 1010, a wafer stage top plate; 1015, an x-y stage; 1033, a load cell; and 1034, a support base.

FIG. 12 shows the arrangement of the wafer stage in FIG. 11. In FIG. 12, reference numeral 1007 denotes a wafer; 1008, an x-axis laser interferometer mirror; 1009, a y-axis laser interferometer mirror; 1010, a wafer stage top plate; 1015, an x-y stage; 1018, an x-axis slider; 1019, a y-axis slider; 1020, a y-axis drive linear motor movable element; 1021, a y-axis drive linear motor stator; and 1022, a wafer stage surface plate.

FIG. 13 is a sectional view taken along a line A—A' in FIG. 12. In FIG. 13, reference numeral 1011 denotes a z-tilt actuator; 1012, a θ-z stage; 1013, a θ-z guide; 1014, a θ-z actuator; 1016, an x-axis drive linear motor movable element; and 1017, an x-axis drive linear motor stator.

In this arrangement, the stage is moved to a position where focus measurement can be done, and then the z-tilt position and posture are adjusted. In this state, the stage is aligned.

Note that no value of the focus measurement device is fed back. Instead, the relative distance and relative posture between the wafer stage top plate 1010 and θ-z stage 1012 are feedback-controlled by a distance measurement device (not shown) to keep the aligned state constant.

If the main body structure does not deform at all, the focus measurement device continuously outputs a constant measurement value.

If the main body structure support force is varied to typically elastically deform the main body structure and change the measurement value of the focus measurement device, variations in focus measurement value, i.e., variations in measurement error become equal to the linear sum of variations in the main body structure support force.

In other words, if support forces measured at all points for supporting the main body structure are multiplied by any coefficient matrix, focus measurement errors can be predicted.

A method of obtaining this coefficient matrix will be described.

While the stage is aligned, the support forces of respective support legs are varied one by one. The vibration wave preferably includes many low-frequency components. For example, the vibration wave may include the cumulation of pink or random noise components.

As a detailed example, a vibration method using a pneumatic spring type vibration reduction leg that is often used in the support base of the projection exposure apparatus will be described.

Figure 14:
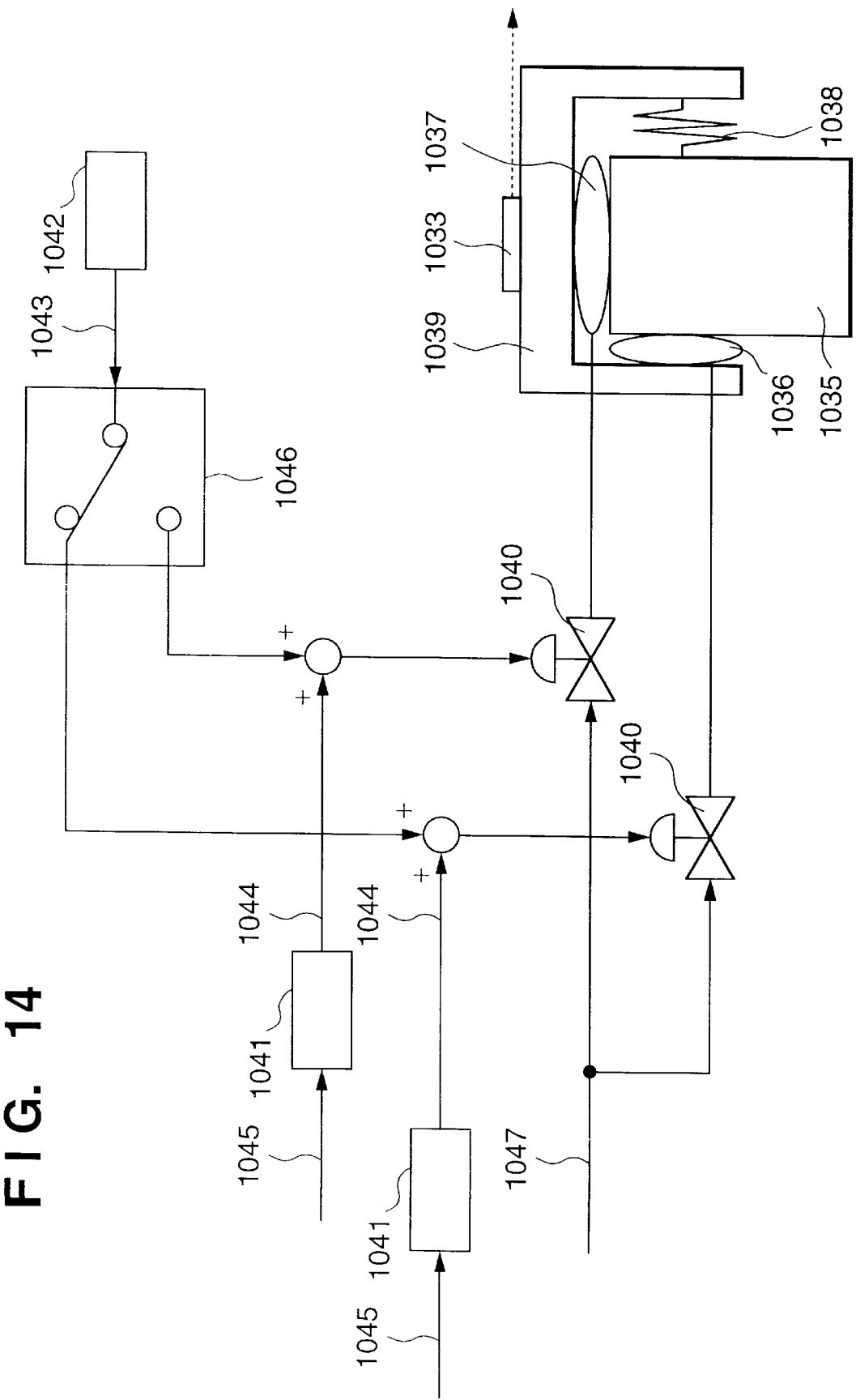
FIG. 14 is a diagram showing a support leg with a vibration reduction function in the semiconductor exposure apparatus according to the fifth embodiment.

In FIG. 14, the vibration reduction leg comprises a housing 1039 attached to a support column 1035 via a horizontal pneumatic spring 1036, a horizontal balance spring 1038, and a vertical pneumatic spring 1037, which face each other. Air amounts supplied to the pneumatic springs 1036 and 1037 via an air supply path 1047 are controlled by controlling control valves 1040 by control signals 1044 output from control valve controllers 1041 which receive the measurement values of the level of the housing 1039 and the pressures of the pneumatic springs 1036 and 1037 as feedback signals 1045. To vary the support forces of the respective pneumatic springs in the pneumatic spring type vibration reduction base, a vibration signal 1043 output from a wave generator 1042 is switched by a switch 1046 or the like and added to the respective control signals 1044.

The support forces of the respective support legs may be simultaneously varied. In this case, waveforms added to the respective control signals must be independent of each other.

As data to be measured, all support forces and the value of the focus measurement device are simultaneously measured regardless of the vibration method.

The support force in each direction is preferably measured using the load cell 1033, but can be measured using a pressure gauge for measuring the pressure of each pneumatic spring because a measurement value proportional to variations in the support force can be attained.

The measurement values are substituted into equation (3) to obtain the coefficient matrix A. Using this coefficient matrix, the measurement error of the focus measurement device caused by variations in the main body structure support force can be predicted and corrected.

Since the coefficient matrix changes depending on the wafer shot position, a coefficient matrix calculated at a representative shot position is desirably interpolated and approximated in accordance with a shot position. If the coefficient matrix is considered to be constant regardless of the stage position, it need not be interpolated and approximated. A support force which hardly influences measurement errors may be removed from measurement targets. Instead of measuring the support force, a physical quantity proportional to variations in the support force may be measured.

In an application of the present invention, a predicted measurement error is removed from the focus measurement value in real time.

<Sixth Embodiment>

Figure 15:
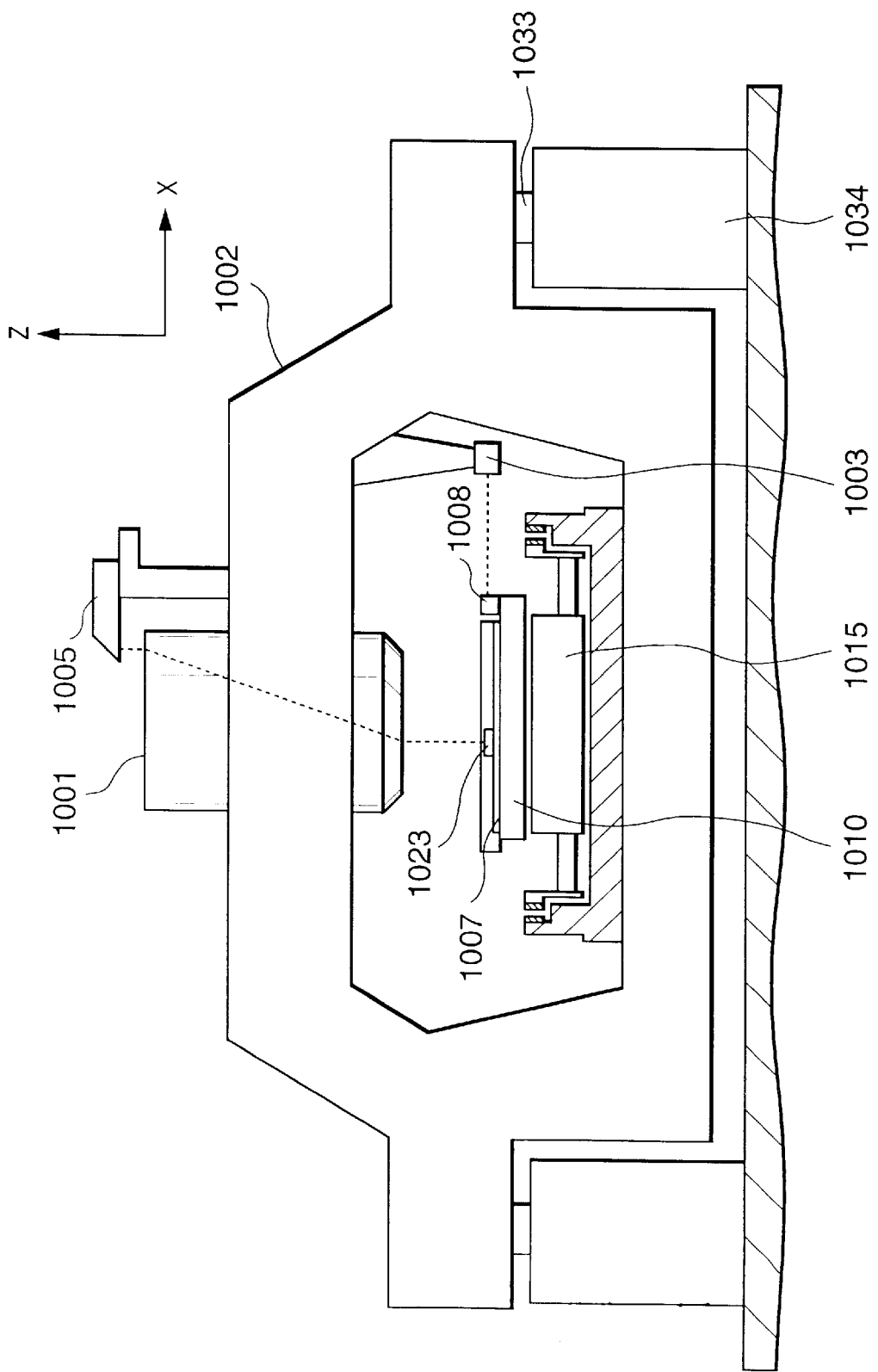
FIG. 15 is a front view for explaining correction of TTL off-axis alignment measurement errors according to the sixth embodiment of the present invention.

In the sixth embodiment shown in FIG. 15, the present invention is applied to correction of TTL off-axis scope measurement errors in the projection exposure apparatus.

In FIG. 15, reference numeral 1001 denotes a projection lens; 1002, a main body structure; 1003, a wafer stage laser interferometer; 1005, a TTLoff-axis scope; 1007, a wafer; 1008, an x-axis laser interferometer mirror; 1010, a wafer stage top plate; 1015, anx-y stage; 1023, a TTL off-axis scopemark; 1033, a load cell; and 1034, a support base.

In this arrangement, the stage is moved to a position where the TTL off-axis scope 1005 can measure the TTL off-axis scope mark 1023 at each shot, and then the z-tilt position and posture are adjusted. In this state, the support forces of respective support legs are varied one by one. The vibration method is the same as in the fifth embodiment.

As data to be measured, all support forces and the value of the TTL off-axis scope 1005 are simultaneously measured regardless of the vibration method.

The measurement values are substituted into equation (3) to obtain the coefficient matrix A. Using this coefficient matrix, the measurement error of the TTL off-axis scope caused by variations in the main body structure support force can be predicted and corrected.

Since the coefficient matrix changes depending on the wafer shot position, a coefficient matrix calculated at a representative shot position is desirably interpolated and approximated in accordance with a shot position. If the coefficient matrix is considered to be constant regardless of the stage position, it need not be interpolated and approximated. A support force which hardly influences measurement errors may be removed from measurement targets. Instead of measuring the support force, a physical quantity proportional to variations in the support force may be measured.

In an application of the present invention, a predicted focus measurement error is removed from the TTL off-axis scope measurement value in real time.

<Seventh Embodiment>

Figure 16:
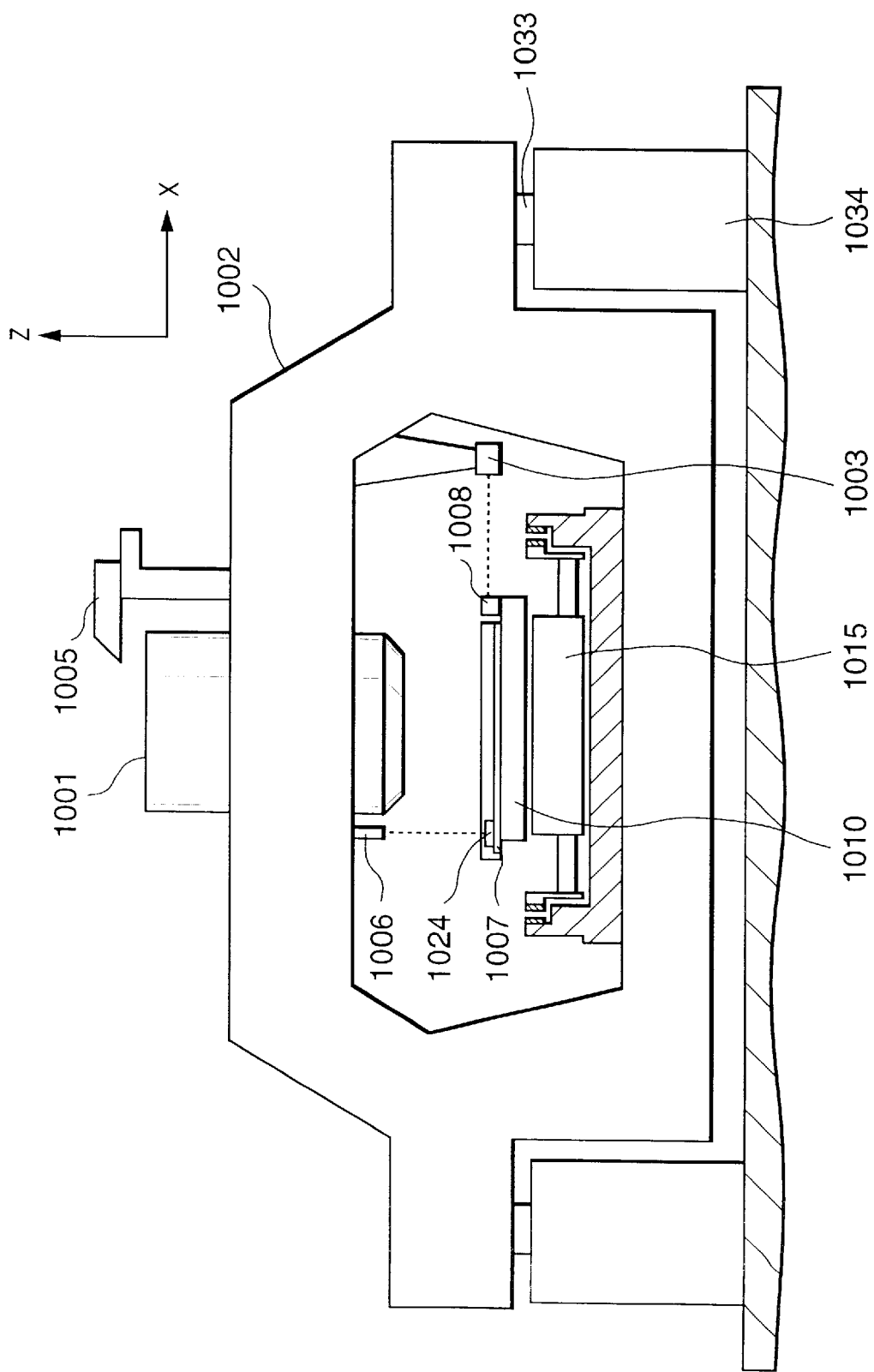
FIG. 16 is a front view for explaining correction of off-axis alignment measurement errors according to the seventh embodiment of the present invention.

In the seventh embodiment shown in FIG. 16, the present invention is applied to correction of off-axis scope measurement errors in the projection exposure apparatus.

In FIG. 16, reference numeral 1001 denotes a projection lens; 1002, a main body structure; 1003, a wafer stage laser interferometer; 1006, an off-axis scope; 1007, a wafer; 1008, an x-axis laser interferometer mirror; 1010, a wafer stage top plate; 1015, an x-y stage; 1024, an off-axis scope mark; 1033, a load cell; and 1034, a support base.

In this arrangement, the stage is moved to a position where the off-axis scope 1006 can measure the off-axis scope mark 1024 at each shot, and then the z-tilt position and posture are adjusted. In this state, the support forces of respective support legs are varied one by one. The vibration method is the same as in the fifth embodiment.

As data to be measured, all support forces and the value of the off-axis scope 1006 are simultaneously measured regardless of the vibration method.

The measurement values are substituted into equation (3) to obtain the coefficient matrix A. Using this coefficient matrix, the measurement error of the off-axis scope caused by variations in the main body structure support force can be predicted and corrected.

Since the coefficient matrix changes depending on the wafer shot position, a coefficient matrix calculated at a representative shot position is desirably interpolated and approximated in accordance with a shot position. If the coefficient matrix is considered to be constant regardless of the stage position, it need not be interpolated and approximated. A support force which hardly influences measurement errors may be removed from measurement targets. Instead of measuring the support force, a physical quantity proportional to variations in the support force may be measured.

In an application of the present invention, a predicted focus measurement error is removed from the off-axis scope measurement value in real time.

<Eighth Embodiment>

Figure 17:
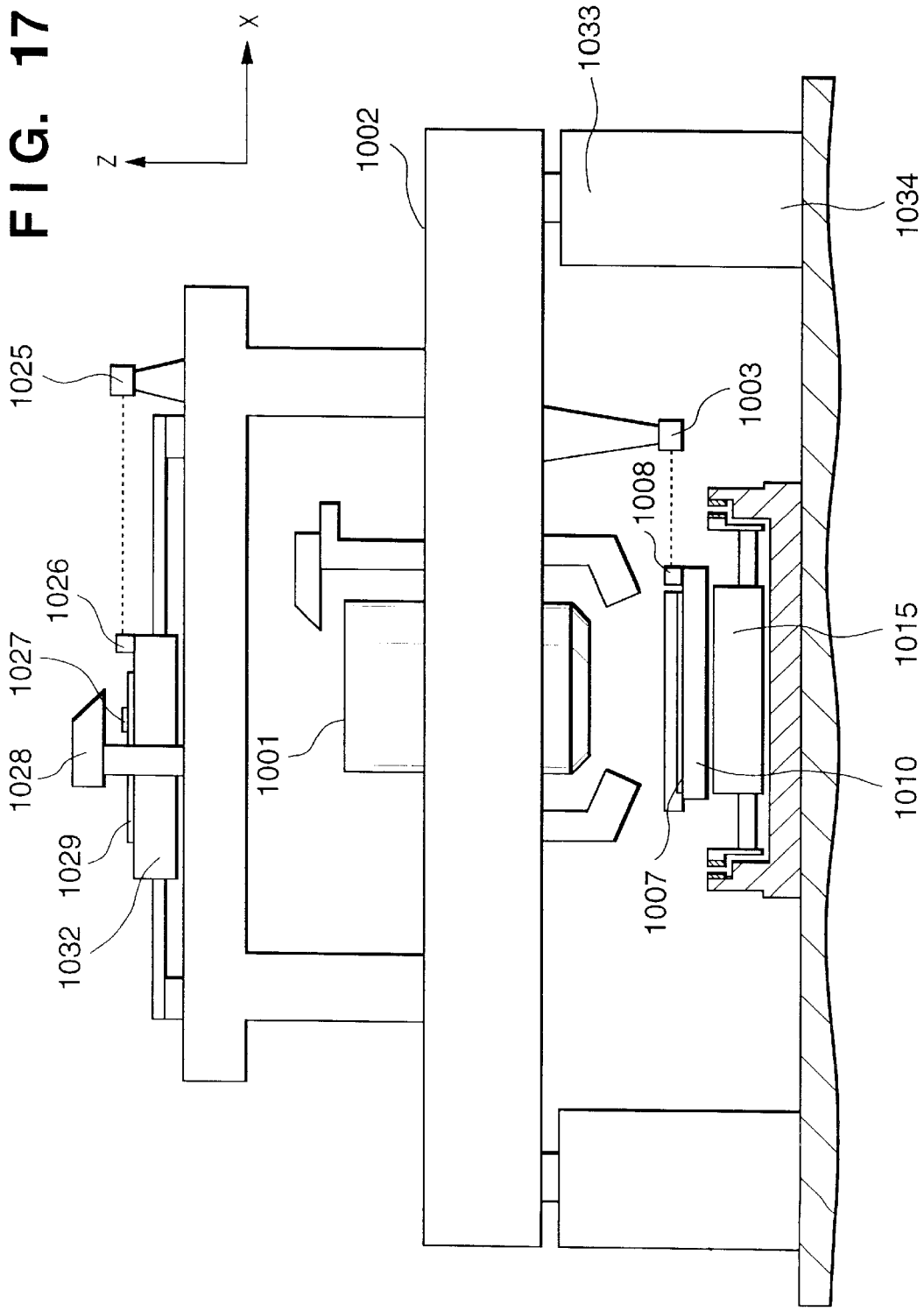
FIG. 17 is a front view for explaining correction of reticle alignment measurement errors according to the eighth embodiment of the present invention.

In the eighth embodiment shown in FIG. 17, the present invention is applied to correction of reticle alignment measurement errors in the projection exposure apparatus.

In FIG. 17, reference numeral 1001 denotes a projection lens; 1002, a main body structure; 1025, a reticle stage laser interferometer; 1028, a reticle alignment scope; 1027, a reticle alignment scope mark; 1029, a reticle; 1026, a laser interferometer mirror; 1032, a reticle stage top plate; 1033, a load cell; and 1034, a support base.

In this arrangement, the stage is moved to a position where the reticle alignment scope 1028 can measure the alignment mark 1027 on the reticle 1029, and then the z-tilt position and posture are adjusted. In this state, the support forces of respective support legs are varied one by one. The vibration method is the same as in the fifth embodiment.

As data to be measured, all support forces and the value of the reticle alignment scope 1028 are simultaneously measured regardless of the vibration method.

The measurement values are substituted into equation (3) to obtain the coefficient matrix A. Using this coefficient matrix, the measurement error of the reticle alignment scope 1028 caused by variations in the main body structure support force can be predicted and corrected.

Note that a support force which hardly influences measurement errors may be removed from measurement targets. Instead of measuring the support force, a physical quantity proportional to variations in the support force may be measured.

In an application of the present invention, a predicted reticle alignment measurement error is removed from the reticle alignment measurement value in real time.

<Ninth Embodiment>

Figure 18:
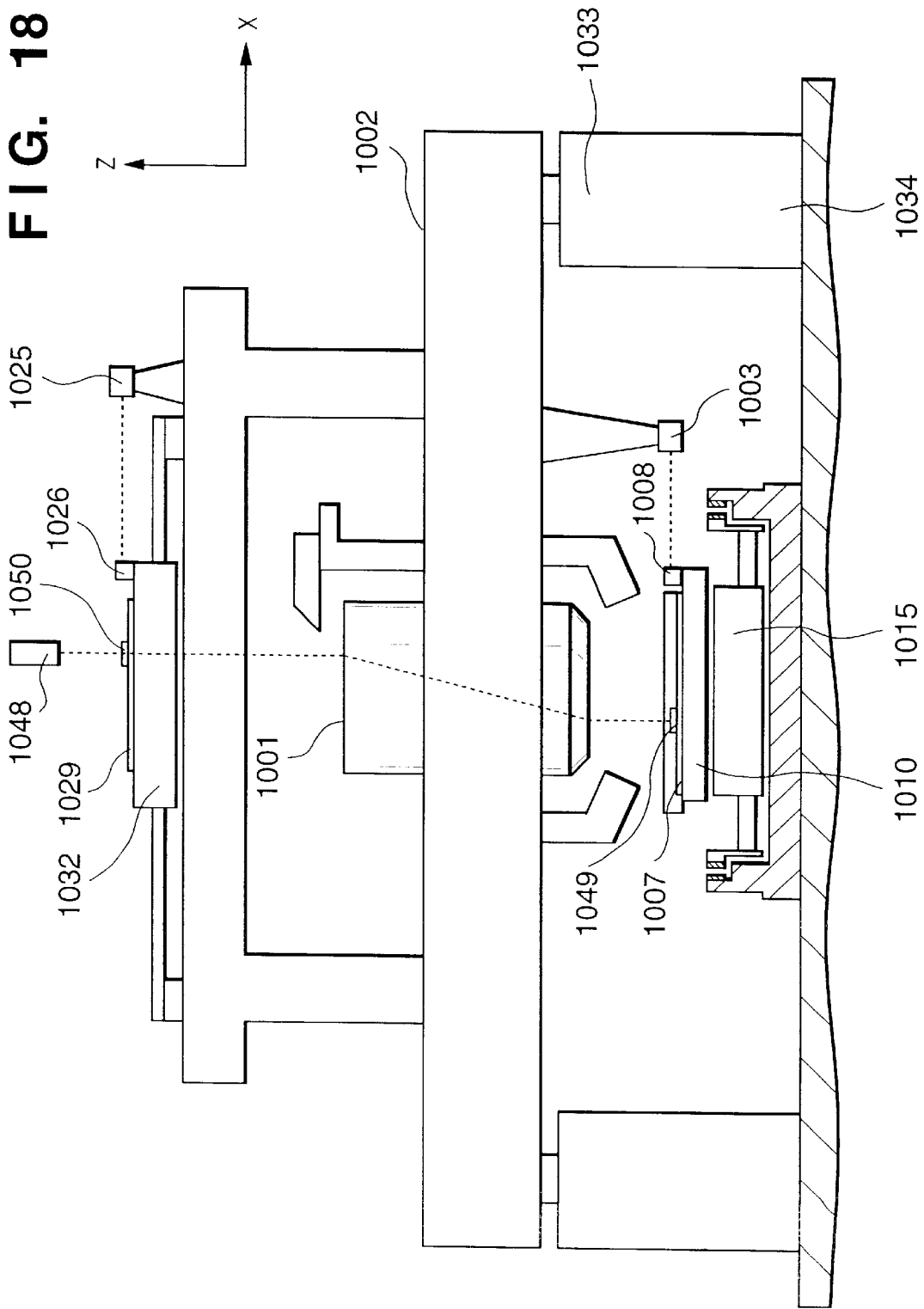
FIG. 18 is a front view for explaining correction of TTL on-axis alignment measurement errors according to the ninth embodiment of the present invention.

In the ninth embodiment shown in FIG. 18, the present invention is applied to correction of TTL on-axis alignment measurement errors in the projection exposure apparatus.

In FIG. 18, reference numeral 1001 denotes a projection lens; 1002, a main body structure; 1003, a wafer stage interferometer; 1007, a wafer; 1025, a reticle stage laser interferometer; 1048, a TTL on-axis alignment scope; 1049, a TTL on-axis alignment scope mark; 1029, a reticle; 1026, a laser interferometer mirror; 1032, a reticle stage top plate; 1033, a load cell; and 1034, a support base.

In this arrangement, the stage is moved to a position where a TTL on-axis alignment scope mark on the reticle 1029 and the TTL on-axis alignment scope mark 1049 on the wafer 1007 can be compared and measured via the projection lens 1001. In this state, the support forces of respective support legs are varied one by one. The vibration method is the same as in the fifth embodiment.

As data to be measured, all support forces and the measurement value of the TTL on-axis alignment scope 1048 are simultaneously measured regardless of the vibration method.

The measurement values are substituted into equation (3) to obtain the coefficient matrix A. Using this coefficient matrix, the measurement error of the TTL on-axis alignment scope 1048 caused by variations in the main body structure support force can be predicted and corrected.

Note that a support force which hardly influences measurement errors may be removed from measurement targets. Instead of measuring the support force, a physical quantity proportional to variations in the support force may be measured.

The TTL on-axis alignment scope 1048 is considered to be on the optical axis of exposure and thus not to have any measurement error caused by a reference shift. Hence, variations in measurement value of the TTL on-axis alignment scope 1048 can be considered to be caused by the relative error between the measurement errors of the wafer stage interferometer 1003 and reticle stage interferometer 1025 used for measurement of the stage position.

In an application of the present invention, a predicted measurement error is removed from the measurement value of the wafer stage interferometer or reticle stage interferometer in real time.

As described above, according to the fifth to ninth embodiments, since all operating forces which elastically deform the main body structure and resultant measurement errors are predicted and corrected, measurement errors due to the elastic deformation can be corrected as if a structure having infinitely high rigidity is realized. Therefore, the influences of the drive repulsion force of the moving stage mounted on the main body structure, movement of the barycenter, and vibrations from the floor can be avoided.

Recent vibration reduction devices employ an active vibration reduction device or vibration reduction device with a linear motor, or suppress deformation of the main body structure by regulating the vibration spectrum of the floor itself. However, the present invention does not require such a device or regulation, and thus, the vibration reduction cost can be greatly reduced.

<10th Embodiment>

According to present invention, variations in distance between the position control point and position measurement point are predicted and corrected using a vector obtained by measuring, by the sensor, a principal force acting on the stage or physical quantity proportional to it, and any one of the monitor value of the current value of a motor for driving the stage and the measurement value of a load cell or strain gauge installed at a portion where the drive repulsion force of the motor acts, and multiplying the measurement values of the sensor by an appropriate coefficient matrix.

In this case, an appropriate coefficient matrix must be accurately estimated. To meet this demand, a method of estimating the coefficient matrix will be described in detail.

In the present invention, a command signal is supplied to give the stage drive force the waveform of white noise or sine wave sweep. Variations in stage drive force or physical quantities proportional to them are measured, while the position is simultaneously measured in a stage position measurement and another evaluation position measurement.

Since a semiconductor exposure apparatus comprises an alignment measurement device for measuring the wafer position using the optical axis of exposure as a reference, the alignment measurement device can be conveniently used as an evaluation position measurement device.

The measurement value vector of the evaluation position measurement device is given by $$Dx+dx=Dx_0+dx_0+A(F_e+f_e)+dx_e \quad (9)$$

where

Dx: column vector representing the mean of values of the evaluation position measurement device dx: column vector representing variations in values of the evaluation position measurement device $Dx_0$: column vector representing the mean of differences between the values of the stage position measurement device and command values, i.e., positional deviations $dx_0$: column vector representing variations in positional deviations A: coefficient matrix $F_e$: mean value of column vectors representing stage drive forces or physical quantities proportional to them $f_e$: variations in column vectors representing stage drive forces or physical quantities proportional to them $dx_e$: another error.

Constant terms are subtracted from the two sides of equation (9) to obtain $$dx=dx_0+Af_e+dx_e \quad (10)$$

At this time, the coefficient matrix estimate A is obtained to minimize the sum of squares of the correction residual $dx_e$.

More specifically, the estimate A can be obtained using a pseudo inverse matrix:

$$A=(dx-dx_0)*pinv(f_e) \quad (11)$$

where pinv(*) represents the pseudo inverse matrix.

The error of the stage position measurement value caused by elastic deformation of the stage can be removed by a correction vector calculated from the product of the obtained coefficient matrix A and the column vector representing a stage drive force always measured by the sensor or a physical quantity proportional to it.

Note that correction cannot be accurately done if measurement of the stage drive force or physical quantity proportional to it by the sensor, and measurement of the stage position have a timing difference. Thus, these measurements are preferably simultaneously done.

In this way, at least measurement errors caused by the stage drive force are corrected in the alignment stage in which a target position measurement point and actual position measurement point have a distance, and this distance changes owing to elastic deformation by the stage drive force.

In some cases, measurement errors cannot be corrected in a high-frequency region where the natural frequency of the stage is excited. However, this does not pose any serious problem in practical use because when the natural frequency of a stage movable element is satisfactorily high or even low, high-frequency components of measurement errors caused by deformation of the stage decrease while the stage shifts to a state in which no stage drive force acts, thereby attenuating high-frequency vibrations, i.e., the stage is at rest or moves at a constant speed.

In the 10th embodiment, since error components can be predicted, the throughput can increase while maintaining high superposing precision. With the use of this means, performance demanded for the structure shifts from high rigidity to high reproducibility, and an excessive increase in weight of the stage structure can be prevented.

The present invention can be easily practiced only by attaching a sensor for measuring the stage drive force or physical quantity proportional to it and improving measurement control software without requiring large changes in design.

A detailed embodiment will be described.

Figure 19:
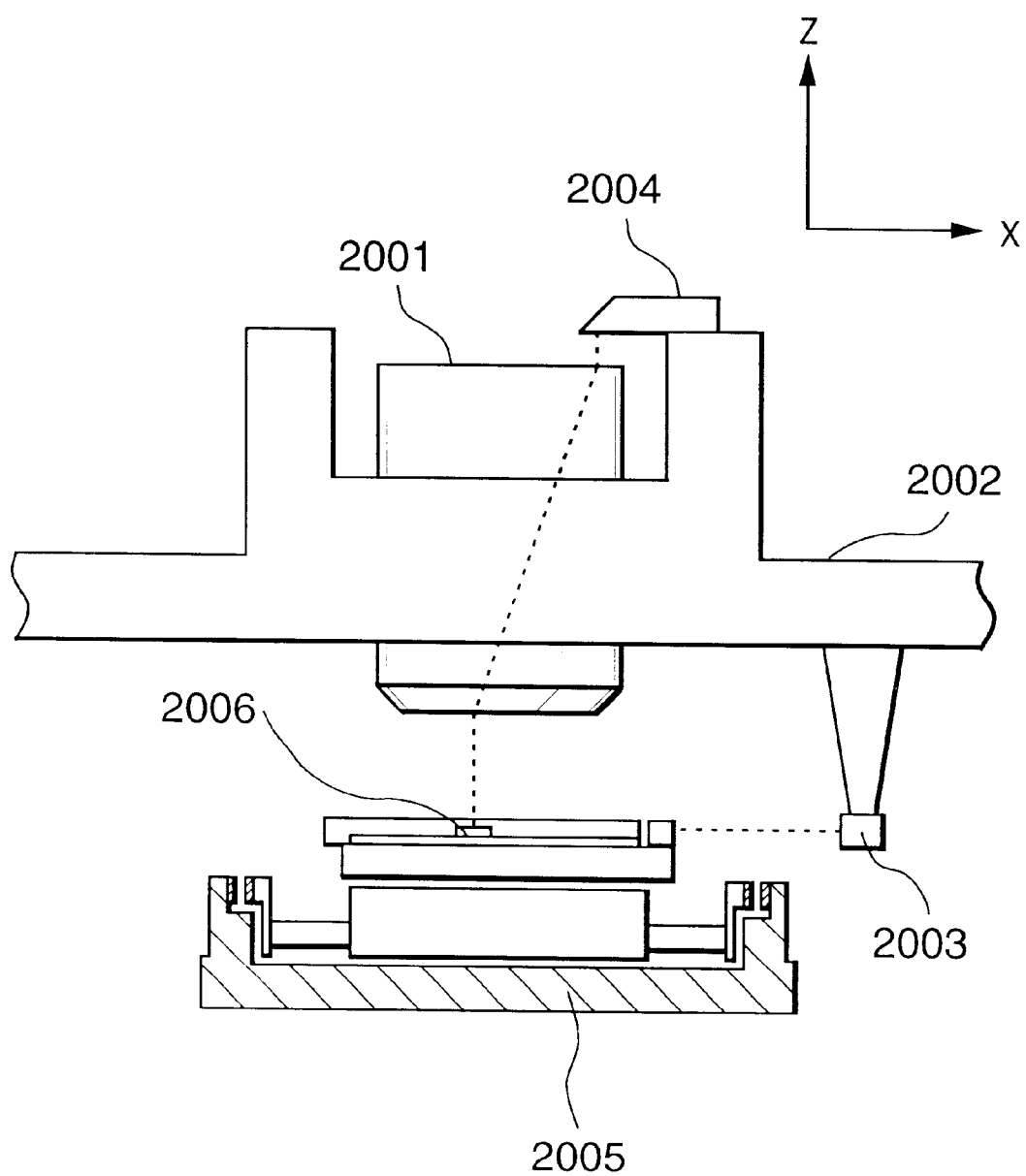
FIG. 19 is a front view showing a semiconductor exposure apparatus according to the 10th embodiment.
Figure 20:
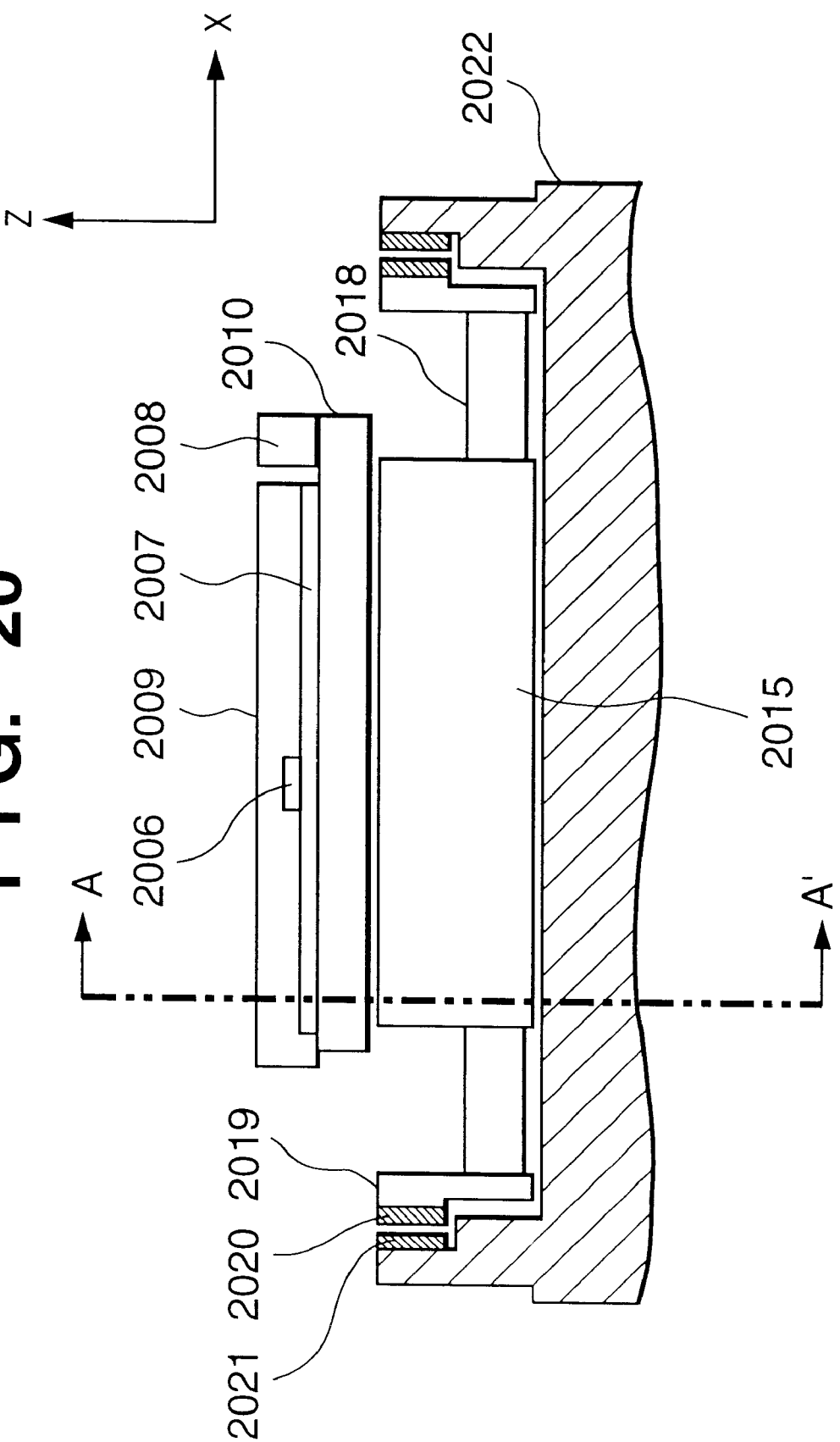
FIG. 20 is a front view showing the stage of the semiconductor exposure apparatus according to the 10th embodiment.
Figure 21:
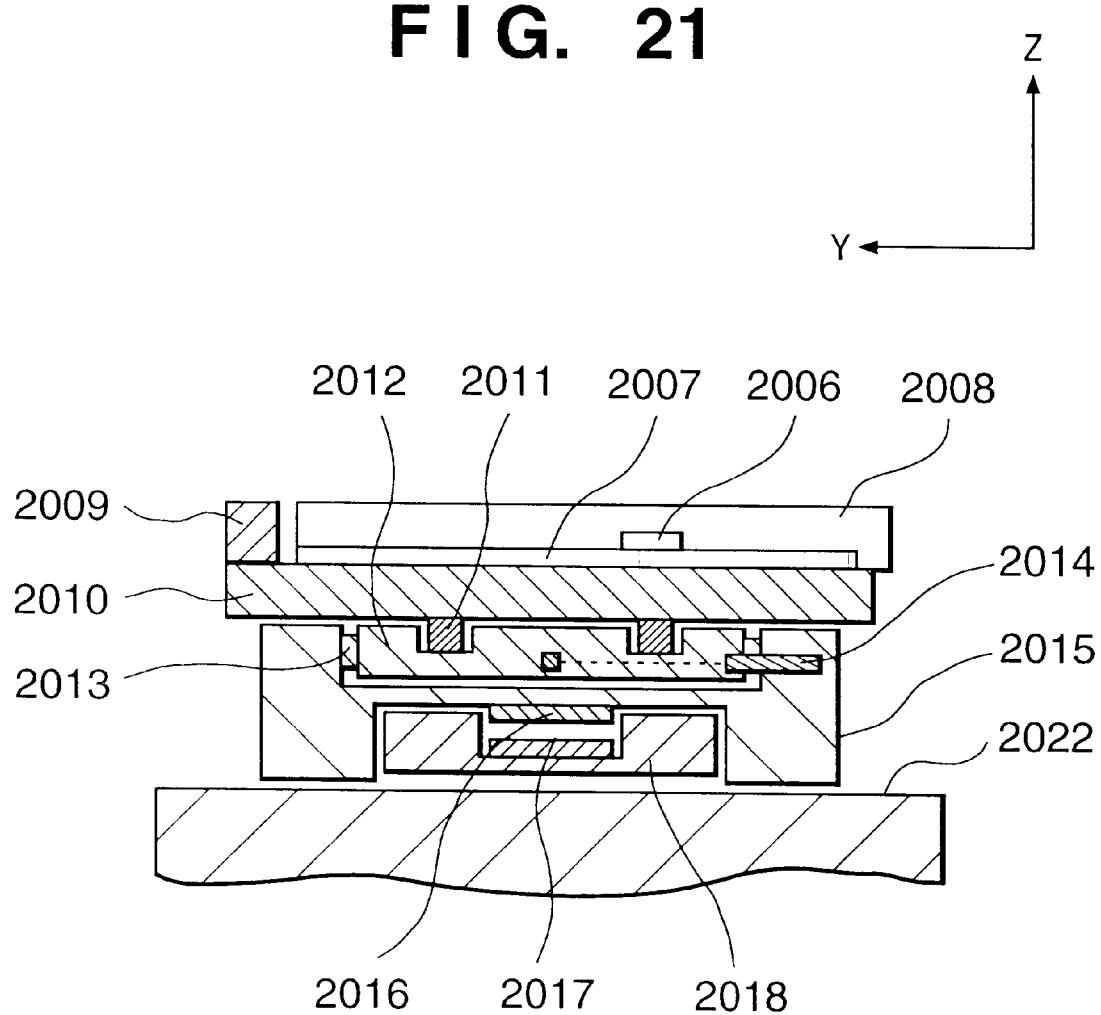
FIG. 21 is a sectional view showing the stage of the semiconductor exposure apparatus according to the 10th embodiment.

In the 10th embodiment shown in FIGS. 19, 20, and 21, the present invention is applied to the wafer stage of a projection exposure apparatus, and the correction coefficient is estimated using an alignment TTL off-axis scope as an evaluation position measurement device.

In FIG. 19, reference numeral 2001 denotes a projection lens; 2002, a main body structure; 2003, a wafer stage laser interferometer; 2004, a TTL off-axis scope; 2005, a wafer stage; and 2006, a TTL off-axis scope mark. In addition, a sensor (not shown) like the described-above one for measuring a force acting on the stage or physical quantity proportional to it is arranged. FIGS. 20 and 21 show the wafer stage 2005 in FIG. 19 in detail.

In FIG. 20, reference numeral 2007 denotes a wafer; 2008, an x-axis laser interferometer mirror; 2009, a y-axis laser interferometer mirror; 2010, a wafer stage top plate; 2018, an x-axis slider; 2019, a y-axis slider; 2020, a y-axis drive linear motor movable element; 2021, a y-axis drive linear motor stator; and 2022, a wafer stage surface plate.

In FIG. 21, reference numeral 2011 denotes a z-tilt actuator; 2012, a θ-z stage; 2013, a leaf spring guide; 2014, a θ-z actuator; 2015, an x-y stage; 2016, an x-axis drive linear motor movable element; and 2017, an x-axis drive linear motor stator.

Estimation of the coefficient matrix A in the 10th embodiment will be explained.

The stage is moved to a position where the TTL off-axis scope can measure the mark 2006 written on the wafer 2007. In this state, the actuators of the respective axes, i.e., the x-axis linear motor, y-axis linear motor, θ-z-axis actuator, and z-tilt actuator are vibrated in units of axes, while the drive current values of the respective axes, the measurement values of the x- and y-axes by the TTL off-axis scope, the deviation of the x-axis laser interferometer 2003, the deviation of a y-axis laser interferometer (not shown), and the deviation of a θ-z-axis laser interferometer (not shown) are measured.

The measurement values are substituted into equation (11) to obtain the coefficient matrix A. Using a correction vector obtained by multiplying this coefficient matrix by the measurement values of the sensor, the measurement errors of the laser interferometers of the respective axes of the wafer stage caused by elastic deformation by the stage drive force can be corrected.

Since the coefficient matrix changes depending on the wafer shot position, a coefficient matrix calculated at a representative shot position is interpolated and approximated in accordance with a shot position.

<11th Embodiment>

Figure 22:
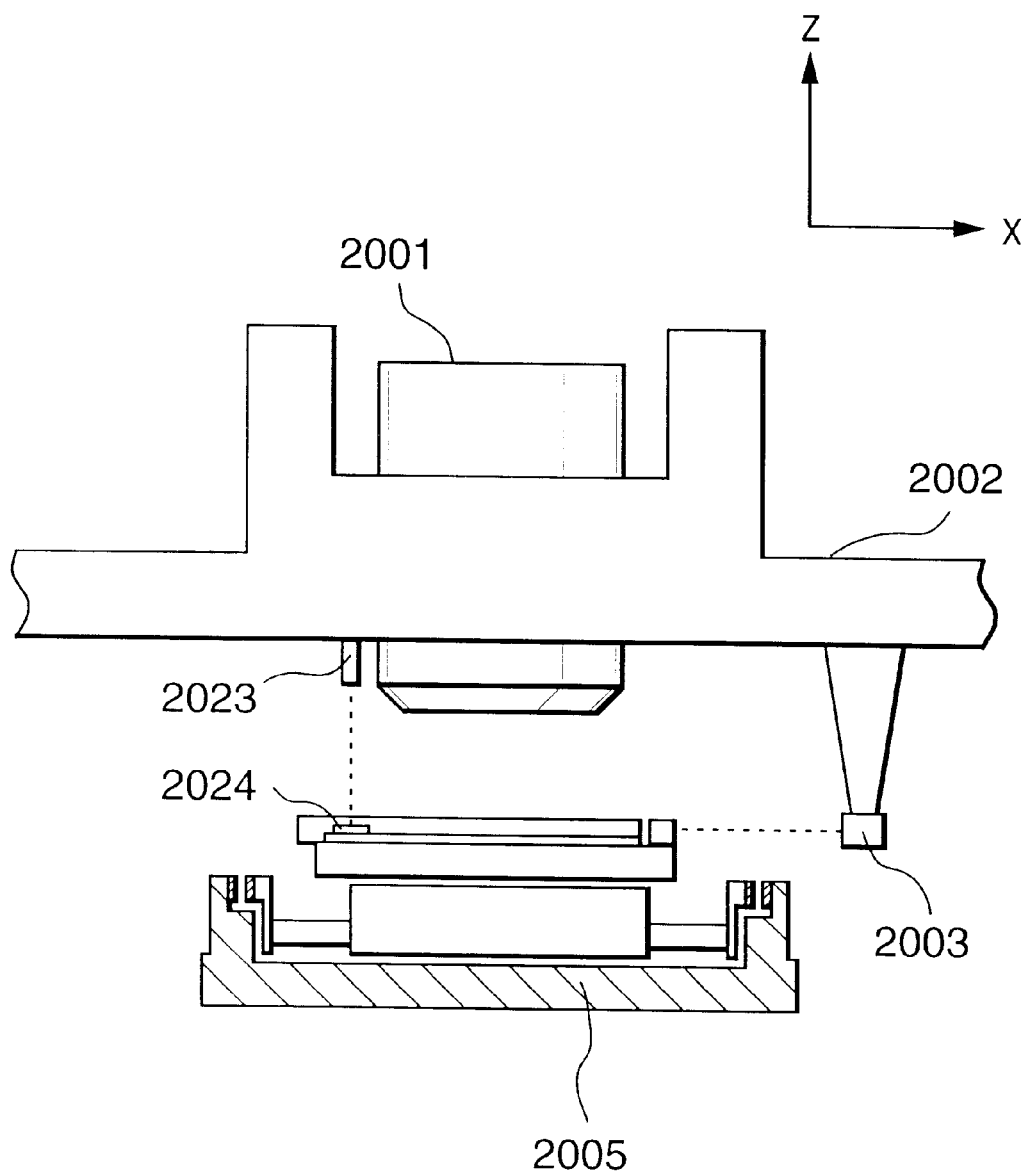
FIG. 22 is a front view showing a semiconductor exposure apparatus according to the 11th embodiment.

In the 11th embodiment shown in FIG. 22, the present invention is applied to an off-axis scope 2023 without intervention of any projection lens, in place of the TTL off-axis scope in the 10th embodiment.

In this case, correction of the laser interferometer is done in measuring global alignment using an off-axis scope mark 2024.

<12th Embodiment>

Figure 23:
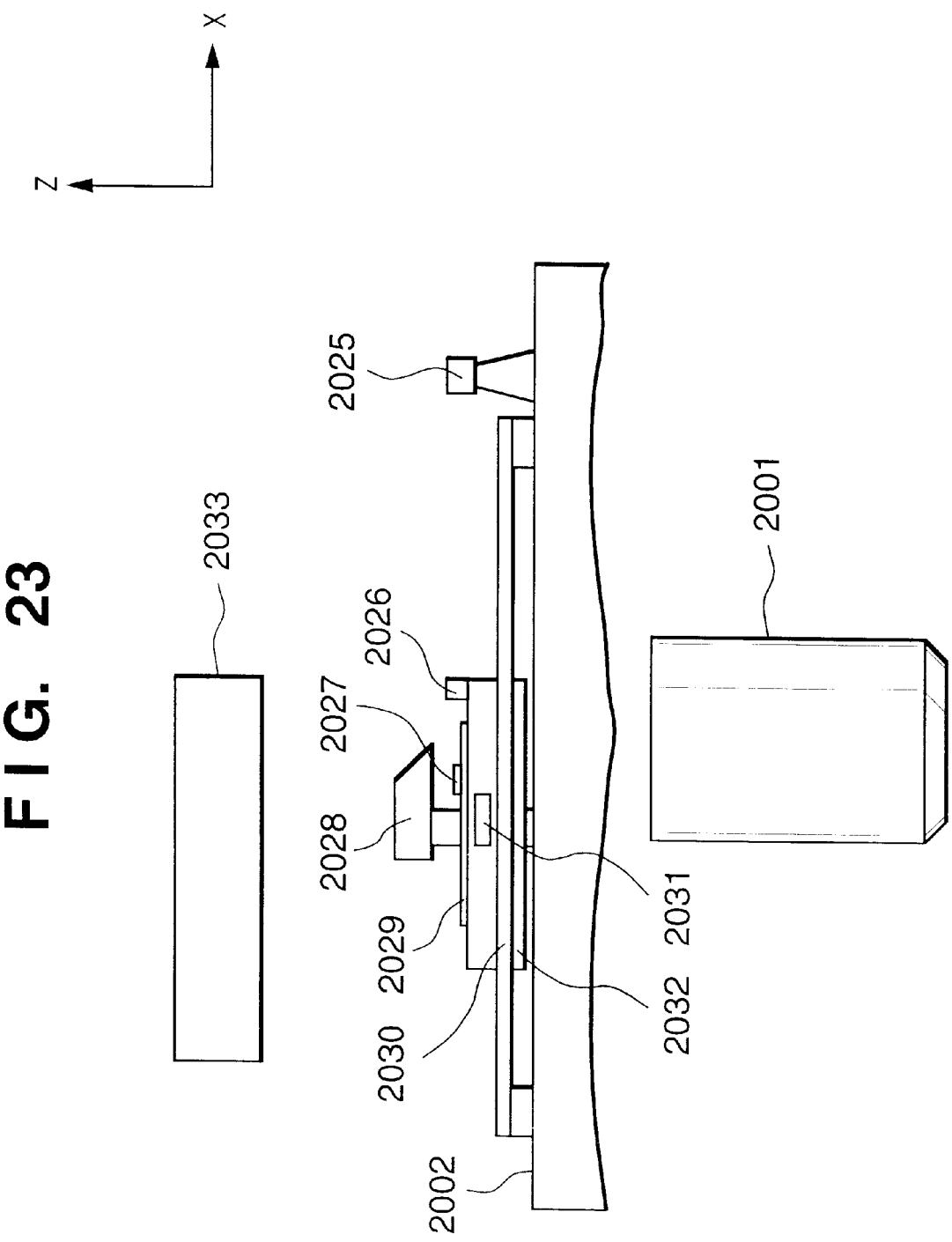
FIG. 23 is a front view showing a semiconductor exposure apparatus according to the 12th embodiment.
Figure 24:
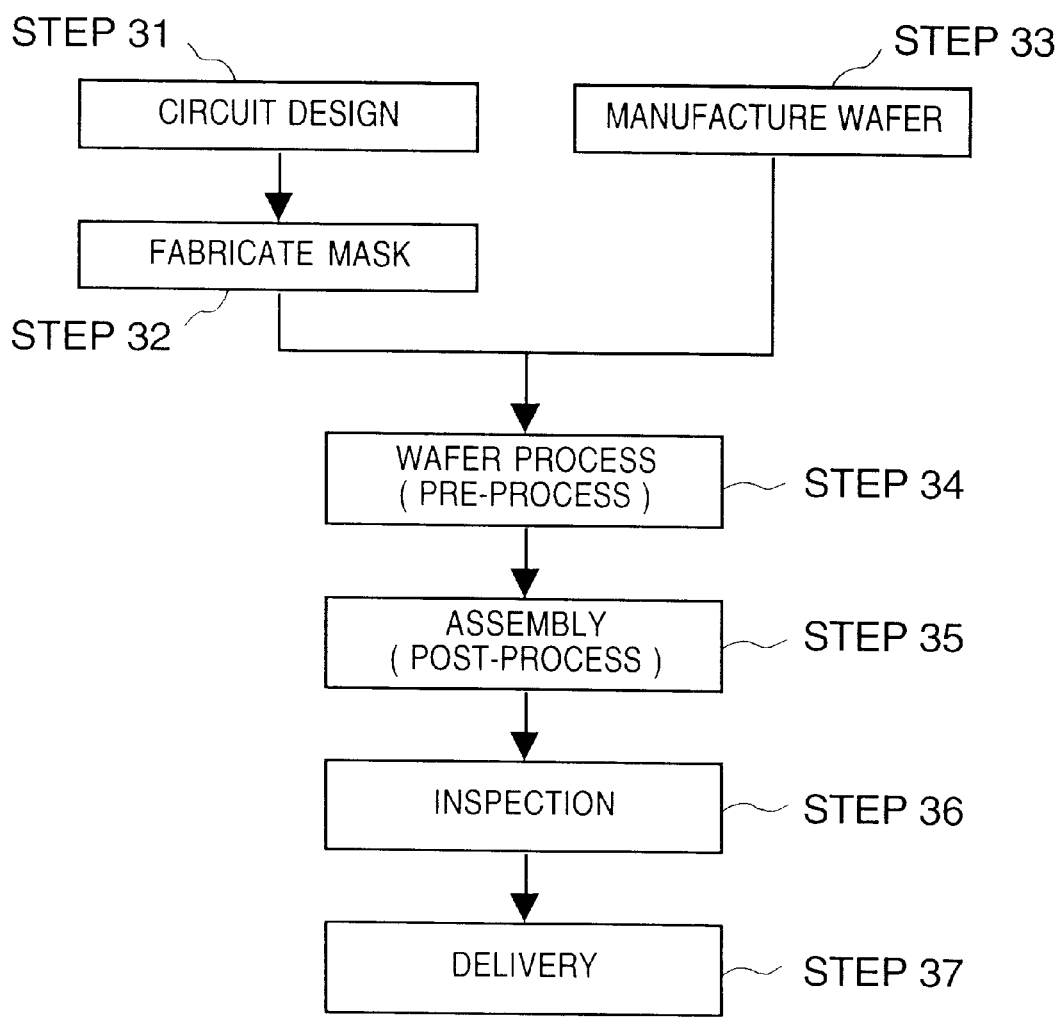
FIG. 24 is a flow chart showing the flow in the manufacture of microdevices.

In the 12th embodiment shown in FIG. 23, the present invention is applied to the reticle stage of a scanning projection exposure apparatus.

In FIG. 23, reference numeral 2025 denotes a reticle stage laser interferometer; 2026, a laser interferometer mirror; 2027, a reticle alignment scope mark; 2028, a reticle alignment scope; 2029, a reticle; 2030, a linear motor stator; 2031, a linear motor movable element; 2032, a reticle stage; and 2033, an illumination system.

Further, a sensor (not shown) like the described-above one for measuring a force acting on the stage or physical quantity proportional to it is arranged.

Estimation of the coefficient matrix A in the 12th embodiment will be explained.

The stage is moved to a position where the reticle alignment scope 2028 can measure the reticle alignment mark 2027 written on the reticle 2029. In this state, the actuator of each axis, i.e., the y-axis linear motor is vibrated, while the drive current value and the deviation of the y-axis laser interferometer of the reticle alignment scope are measured.

The measurement values are substituted into equation (11) to obtain the proportionality coefficient matrix A. Using a correction vector obtained by multiplying this coefficient matrix by the measurement value of the sensor, the measurement error of the y-axis laser interferometer of the reticle stage caused by elastic deformation by the stage drive force can be corrected.

As described above, according to the 10th to 12th embodiments, stage position measurement errors caused by elastic deformation by the stage drive force can be accurately removed without adding any distance sensor, unlike the prior art. As a result, the stage precision can easily increase.

Even if the stage drive force increases owing to high stage speeds, the rigidity of the stage structure need not be increased, and the stage can attain both high precision and high speeds at high level.

An example of the method of manufacturing a device using the above-mentioned exposure apparatus and exposure method will be explained below.

Figure 25:
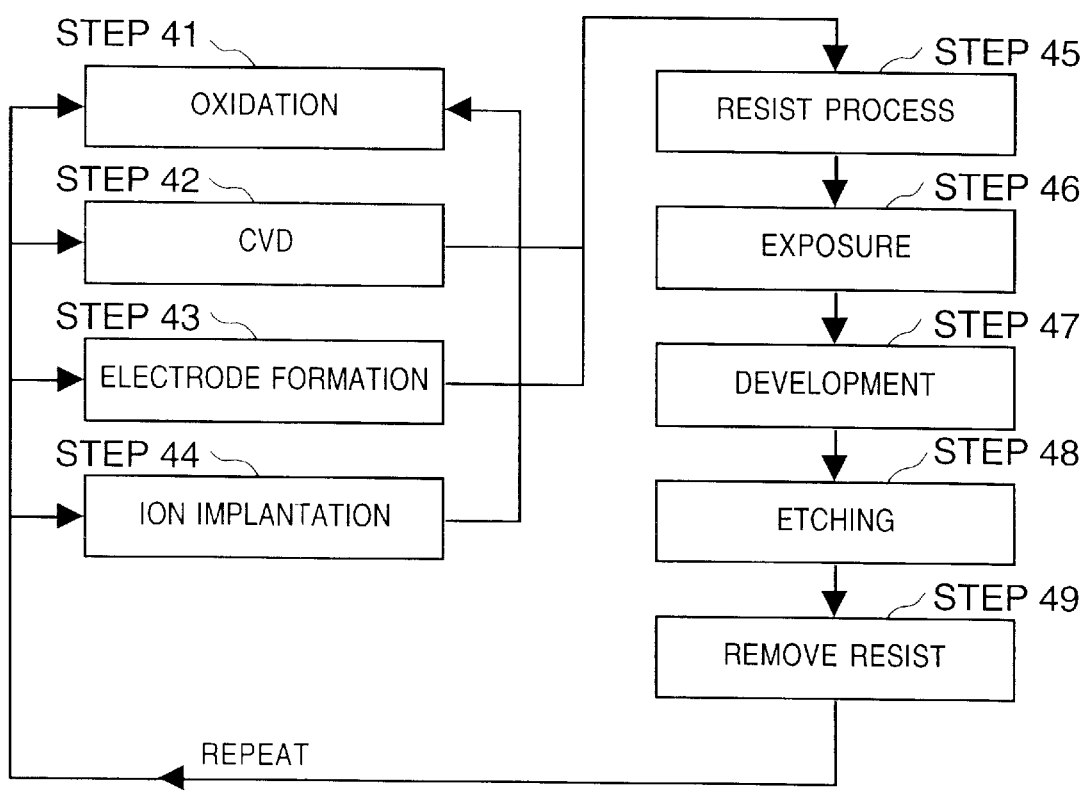
FIG. 25 is a flow chart showing the flow of the wafer process in detail.

FIG. 25 shows the flow in the manufacture of a microdevice (semiconductor chips such as ICs, LSIs, liquid crystal devices, CCDs, thin film magnetic heads, micromachines, and the like). In step 31 (circuit design), the circuit design of a semiconductor device is made. In step 32 (manufacture mask), a mask formed with a designed circuit pattern is manufactured. In step 33 (fabricate wafer), a wafer is fabricated using materials such as silicon, glass, and the like. Step 34 (wafer process) is called a pre-process, and an actual circuit is formed by lithography using the prepared mask and wafer. The next step 35 (assembly) is called a post-process, in which semiconductor chips are assembled using the wafer obtained in step 34, and includes an assembly process (dicing, bonding), a packaging (encapsulating chips), and the like. In step 36 (inspection), inspections such as operation confirmation tests, durability tests, and the like of semiconductor devices assembled in step 35 are run. Semiconductor devices are completed via these processes, and are delivered (step 37).

Figure 26:
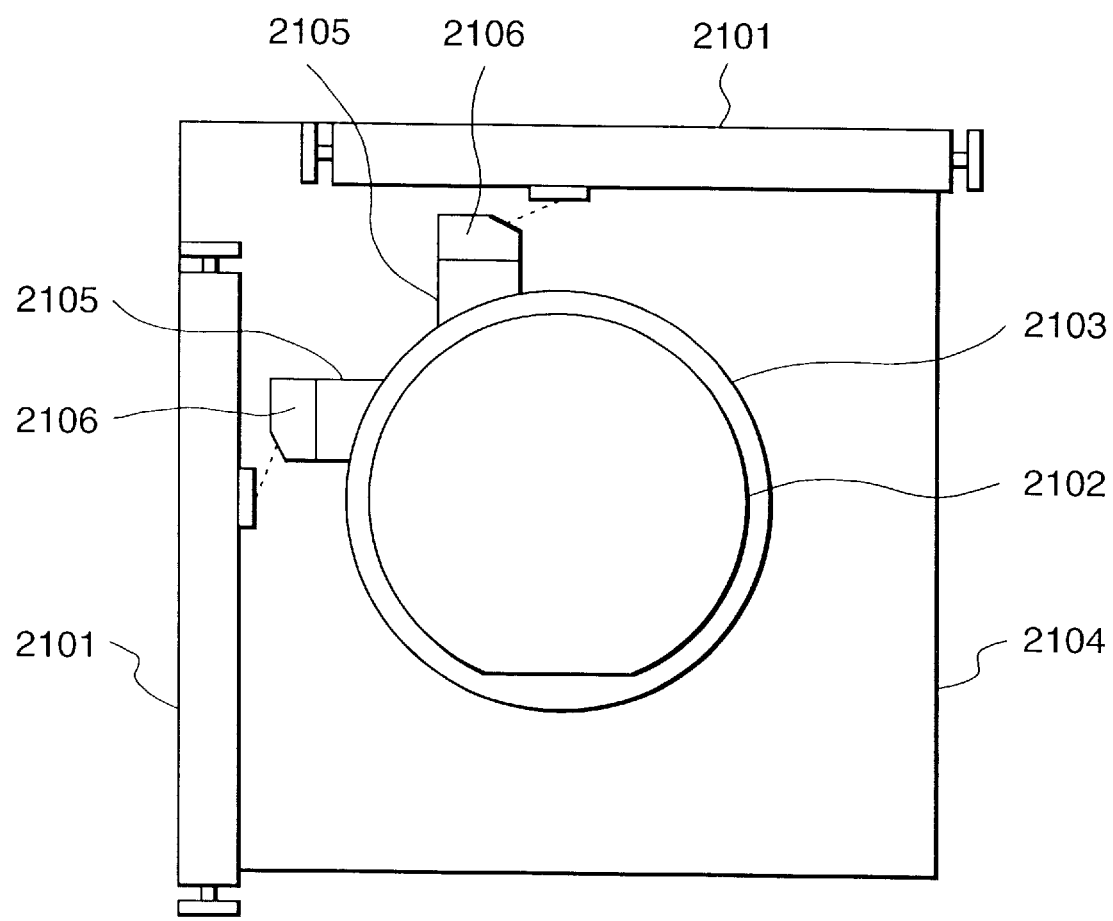
FIG. 26 is a plan view showing the prior art.

FIG. 26 shows the detailed flow of the wafer process. In step 41 (oxidation), the surface of the wafer is oxidized. In step 42 (CVD), an insulating film is formed on the wafer surface. In step 43 (electrode formation), electrodes are formed by deposition on the wafer. In step 44 (ion implantation), ions are implanted into the wafer. In step 45 (resist process), a photosensitive agent is applied on the wafer. In step 46 (exposure), the circuit pattern on the mask is printed on the wafer by exposure using the electron beam exposure apparatus having the alignment system described above. In step 47 (development), the exposed wafer is developed. In step 48 (etching), a portion other than the developed resist image is removed by etching. In step 49 (remove resist), the resist film which has become unnecessary after the etching is removed. By repetitively executing these steps, multiple circuit patterns are formed on the wafer. In this embodiment, in the repetitive processes, accurate alignment can be attained without being influenced by processes by optimally setting the acceleration voltage of an alignment electron beam, as described above.

According to the manufacturing method of this embodiment, a highly integrated semiconductor device, which is not easy to manufacture by the conventional method, can be manufactured at low cost.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus, which comprises a projection optical system for forming an image of a pattern formed on a master plate, a substrate stage for holding and moving a substrate to be exposed to an imaging position, position measurement means for measuring a position of the master plate or substrate or relative positions of the master plate and substrate, alignment means for moving the master plate or substrate on the basis of a measurement value of said position measurement means to adjust the position or relative positions, a main body structure for holding said projection optical system, said substrate stage, and said position measurement means, and a support base for supporting said main body structure, said apparatus comprising:

measurement means for measuring (i) a variation amount of a principal force acting between said main body structure and said support base or (ii) a distortion resulting from a force acting on the main body structure by a vibration reduction device; and correction means for correcting a measurement value of said measurement means using a correction vector obtained by multiplying the measurement result of said measurement means by a predetermined coefficient matrix.

2. The apparatus according to claim 1, wherein said measurement means includes at least one of a stage position measurement device for measuring a position of said substrate stage, a focus measurement device for measuring a shift in position or posture of a substrate surface with reference to the imaging position, and an alignment scope for measuring an alignment mark on the substrate so as to superpose a new pattern on a pattern which has been printed on the substrate surface.

3. The apparatus according to claim 2, wherein said alignment scope is one of a TTL on-axis alignment scope for measuring relative positions of alignment marks on the master plate and substrate using light passing on an optical axis of said projection optical system, a TTL off-axis alignment scope for measuring the relative positions of the alignment marks on the master plate and substrate using light passing off the optical axis of said projection optical system, and an off-axis alignment scope for measuring the position of the alignment mark on the substrate outside said projection optical system.

4. The apparatus according to claim 2, wherein said alignment scope is a reticle alignment scope for measuring a position of a reticle using a mark on a reticle as a master plate, and further comprises a reticle stage for holding and moving the reticle to align the reticle.

5. The apparatus according to claim 1, wherein the coefficient matrix is obtained by measuring by said measurement means the position of the substrate on said substrate stage aligned and controlled to keep a position and posture constant, at the same time applying a forced operating force to respective portions for supporting said main body structure, and regressively analyzing a variation amount of a measurement value of said measurement means with respect to variations in the forced operating force.

6. A stage apparatus comprising:

a stage for holding and moving an object;

stage position measurement means for measuring a position of said stage;

a sensor for measuring a variation amount of a principal force acting on said stage or an elastic deformation caused by the stage drive force; and means for correcting a measurement value of the stage position using a correction vector obtained by multiplying a measurement result of said sensor by a predetermined coefficient matrix.

7. The apparatus according to claim 6, wherein said stage position measurement means comprises a laser interferometer and a reflecting mirror.

8. The apparatus according to claim 6, wherein said apparatus further comprises position measurement means arranged in addition to said stage position measurement means, and the predetermined coefficient matrix is obtained by regressively analyzing a variation amount of a stage drive force of each direction when said stage is moved or a physical quantity acting on the stage, and a difference between measurement values of said position measurement means and said stage position measurement means.

9. The apparatus according to claim 6, wherein said sensor is one of means for monitoring a current value of a motor for driving said stages, a load cell or a strain gauge, wherein each of the load cell and strain gauge is arranged at a portion where a drive repulsion force of the motor acts.

10. An exposure apparatus comprising said stage apparatus defined in claim 6, and means for exposing a wafer or reticle mounted on said stage apparatus.

11. A semiconductor device manufacturing method comprising:

a step of manufacturing a device using an exposure apparatus, which comprises a projection optical system for forming an image of a pattern formed on a master plate, a substrate stage for holding and moving a substrate to be exposed to an imaging position, position measurement means for measuring a position of the master plate or substrate or relative positions of the master plate and substrate, alignment means for moving the master plate or substrate on the basis of a measurement value of the position measurement means to adjust the position or relative positions, a main body structure for holding the projection optical system, the substrate stage, and the position measurement means, and a support base for supporting the main body structure;

a measurement step of measuring (i) a variation amount of a principal force acting between the main body structure and the support base or (ii) a distortion resulting from a force acting on the main body structure by a vibration reduction device; and a correction step of correcting a measurement value of said measurement step using a correction vector obtained by multiplying the measurement result of said measurement step by a predetermined coefficient matrix.

12. A device manufacturing method comprising:

an application step of applying a photosensitive agent to a substrate;

an exposure step of exposing the substrate;

a step of developing the substrate that has been exposed in said exposure step; and a step of manufacturing a device using a stage apparatus including a stage for holding and moving an object, stage position measurement means for measuring a position of the stage, a sensor for measuring a variation amount of a principal force acting on the stage or an elastic deformation caused by the stage drive force, and means for correcting a measurement value of the stage position using a correction vector obtained by multiplying a measurement result of the sensor by a predetermined coefficient matrix, wherein the stage position measurement means comprises a laser interferometer and a reflecting mirror.

* * * * *

UNITED STATES PATENT AND TRADEMARK OFFICE
CERTIFICATE OF CORRECTION

PATENT NO.     : 6,330,052 B1
DATED          : December 11, 2001
INVENTOR(S)    : Masami Yonekawa et al.

It is certified that error appears in the above-identified patent and that said Letters Patent is hereby corrected as shown below:

Column 19,
Line 53, "cam" should read -- can --.

Column 22,
Line 62, "anx-y" should read -- an x-y --.

Column 30,
Line 12, "stages," should read -- stage, --.

Signed and Sealed this

Fourth Day of June, 2002

*Attest:*

*Attesting Officer*

JAMES E. ROGAN
*Director of the United States Patent and Trademark Office*